(12) United States Patent
Shin et al.

(10) Patent No.: US 12,453,264 B2
(45) Date of Patent: Oct. 21, 2025

(54) DISPLAY DEVICE AND METHOD OF MANUFACTURING THE SAME

(71) Applicant: Samsung Display Co., LTD., Yongin-si (KR)

(72) Inventors: Hyuneok Shin, Gwacheon-si (KR); Dongmin Lee, Anyang-si (KR); Youngrok Kim, Anyang-si (KR); Joonyong Park, Gunpo-si (KR); Joon Woo Bae, Hwaseong-si (KR); Samtae Jeong, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 440 days.

(21) Appl. No.: 18/108,518

(22) Filed: Feb. 10, 2023

(65) Prior Publication Data

US 2023/0413631 A1 Dec. 21, 2023

(30) Foreign Application Priority Data

Jun. 20, 2022 (KR) .......................... 10-2022-0074866

(51) Int. Cl.
*H10K 59/131* (2023.01)
*H10K 59/12* (2023.01)

(52) U.S. Cl.
CPC ..... *H10K 59/1315* (2023.02); *H10K 59/1201* (2023.02)

(58) Field of Classification Search
CPC ........................ H10K 59/1315; H10K 59/1201
USPC ........................................................ 257/40
See application file for complete search history.

(56) References Cited

U.S. PATENT DOCUMENTS

| | | | |
|---|---|---|---|
| 2007/0235685 A1 | 10/2007 | Seki et al. | |
| 2011/0297944 A1 | 12/2011 | Choi et al. | |
| 2012/0217500 A1* | 8/2012 | Park | H10D 30/6755 |
| | | | 257/E33.053 |
| 2021/0408195 A1* | 12/2021 | Sohn | G09G 3/3225 |
| 2022/0123120 A1 | 4/2022 | Lee et al. | |
| 2022/0320469 A1* | 10/2022 | Suzuki | H10K 59/124 |

FOREIGN PATENT DOCUMENTS

| | | |
|---|---|---|
| EP | 1672962 | 6/2012 |
| KR | 10-0331888 B1 | 4/2002 |
| KR | 10-2006-0012764 | 2/2006 |
| KR | 10-2016-0024039 | 3/2016 |

(Continued)

OTHER PUBLICATIONS

International Search Report dated Aug. 11, 2023 for International patent application PCT/KR2023/006279, 3 pages.

*Primary Examiner* — Xia L Cross
(74) *Attorney, Agent, or Firm* — Womble Bond Dickinson (US) LLP

(57) ABSTRACT

A display device includes a substrate, a metal pattern on the substrate, the metal pattern including a first alloy layer and a first metal layer, wherein the first alloy layer includes a titanium alloy including at least one of copper or zinc and the first metal layer is on the first alloy layer, an active layer on the metal pattern and a gate electrode on the active layer, the gate electrode including a second alloy layer and a second metal layer, wherein the second alloy layer includes a titanium alloy including at least one of copper or zinc and the second metal layer is on the second alloy layer.

20 Claims, 25 Drawing Sheets

(56) References Cited

FOREIGN PATENT DOCUMENTS

| | | |
|---|---|---|
| KR | 10-1716471 B1 | 3/2017 |
| KR | 10-2017-0064606 | 6/2017 |
| KR | 10-2018-0038170 | 4/2018 |
| KR | 10-2018-0076662 | 7/2018 |
| KR | 10-2062243 | 2/2020 |
| KR | 10-2020-0049733 | 5/2020 |
| KR | 10-2021-0004356 A | 1/2021 |
| KR | 10-2021-0008768 | 1/2021 |
| KR | 10-2224029 | 3/2021 |
| KR | 10-2251840 | 5/2021 |
| KR | 10-2297897 | 9/2021 |
| KR | 10-2022-0024379 A | 3/2022 |

\* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2022-0074866 filed on Jun. 20, 2022 in the Korean Intellectual Property Office (KIPO), the entire disclosure of which is hereby incorporated by reference.

BACKGROUND

1. Field

One or more embodiments relate to a display device. More particularly, one or more embodiments relate to a display device and a method of manufacturing the display device.

2. Description of the Related Art

A display device is a device that displays an image for providing visual information to a user. Among display devices, organic light emitting diode displays have recently attracted attention.

Organic light-emitting display devices have a self-emission characteristic and do not require a separate light source, unlike liquid crystal display devices, so that the thickness and weight may be reduced. In addition, organic light emitting diode displays exhibits high quality characteristics such as low power consumption, high luminance, and high reaction speed.

SUMMARY

Aspects of one or more embodiments of the present disclosure are directed toward a display device having a high resolution.

Aspects of one or more embodiments of the present disclosure provide a method of manufacturing the display device.

Additional aspects will be set forth in part in the description which follows and, in part, will be apparent from the description, or may be learned by practice of the presented embodiments of the disclosure.

A display device according to one or more embodiments of the present disclosure may include a substrate, a metal pattern on the substrate, the metal pattern including a first alloy layer and a first metal layer, wherein the first alloy layer includes a titanium alloy including at least one of copper or zinc and the first metal layer is on the first alloy layer, an active layer on the metal pattern and a gate electrode on the active layer, the gate electrode including a second alloy layer and a second metal layer, wherein the second alloy layer includes a titanium alloy including at least one of copper or zinc and the second metal layer is on the second alloy layer.

In one or more embodiments, each of the first metal layer and the second metal layer may include copper.

In one or more embodiments, the active layer may include an oxide semiconductor.

In one or more embodiments, the first alloy layer and the second alloy layer may include the same material.

In one or more embodiments, a content (e.g., amount) of titanium in the titanium alloy may be about 10 at % to about 80 at %, and a content (e.g., amount) of copper or zinc in the titanium alloy may be about 20 at % to about 90 at %.

In one or more embodiments, the content (e.g., amount) of titanium in the titanium alloy may be about 20 at % to about 50 at %, and the content (e.g., amount) of copper or zinc in the titanium alloy may be about 50 at % to about 80 at %.

In one or more embodiments, each of the first alloy layer and the second alloy layer may include a titanium alloy including titanium, copper, and zinc.

In one or more embodiments, a thickness of each of the first alloy layer and the second alloy layer may be between about 30 Å to about 100 Å.

In one or more embodiments, a thickness of each of the first metal layer and the second metal layer may be between about 1500 Å to about 4500 Å.

In one or more embodiments, a thickness of the metal pattern may be the same as a thickness of the gate electrode.

A method of manufacturing a display device according to one or more embodiments of the present disclosure may include forming a first alloy layer including a titanium alloy including at least one of copper or zinc on a substrate, forming a first metal layer on the first alloy layer, forming a metal pattern by patterning the first alloy layer and the first metal layer, forming an active layer on the first metal layer, forming a second alloy layer including a titanium alloy including at least one of copper or zinc on the active layer, forming a second metal layer on the second alloy layer and forming a gate electrode by patterning the second alloy layer and the second metal layer.

In one or more embodiments, the active layer may be formed of an oxide semiconductor.

In one or more embodiments, the forming of the metal pattern may include etching the first alloy layer and the first metal layer utilizing a wet etching technique.

In one or more embodiments, the forming of the gate electrode may include etching the second alloy layer and the second metal layer utilizing a wet etching technique.

In one or more embodiments, a thickness of the metal pattern and a thickness of the gate electrode may be the same (e.g., the metal pattern and the gate electrode are the same in thickness).

In one or more embodiments, the first metal layer and the second metal layer may be formed of copper.

In one or more embodiments, the first alloy layer and the second alloy layer may be formed of the titanium alloy, a content (e.g., amount) of titanium forming the titanium alloy may be about 10 at % to about 80 at %, and a content (e.g., amount) of copper or zinc forming the titanium alloy may be about 20 at % to about 90 at %.

In one or more embodiments, the content (e.g., amount) of titanium forming the titanium alloy may be about 20 at % to about 50 at %, and the content (e.g., amount) of copper or zinc forming the titanium alloy may be about 50 at % to about 80 at %. In one or more embodiments, a thickness of each of the first alloy layer and the second alloy layer may be between about 30 Å to about 100 Å.

In one or more embodiments, a thickness of each of the first metal layer and the second metal layer may be between about 1500 Å to about 4500 Å.

In the display device according to one or more embodiments of the present disclosure, because the electrode or wiring included in the display device includes the alloy layer including the titanium alloy, the width of the electrode or wiring may be controlled or selected (e.g., easily controlled or selected). Accordingly, a fine line width of the electrode or wiring included in the display device may be realized. In one or more embodiments, the electrode or wiring may prevent or substantially prevent hydrogen from diffusing into the active layer, thereby improving the performance of the transistor. Accordingly, a high resolution may be realized in the display device including the electrode or wiring.

In one or more embodiments, because the fine line width of the electrode or wiring is implemented, the metal layer disposed on the alloy layer may include copper. Accordingly, a resistance of the electrode and the wiring may be reduced.

DETAILED DESCRIPTION

Figure 1:
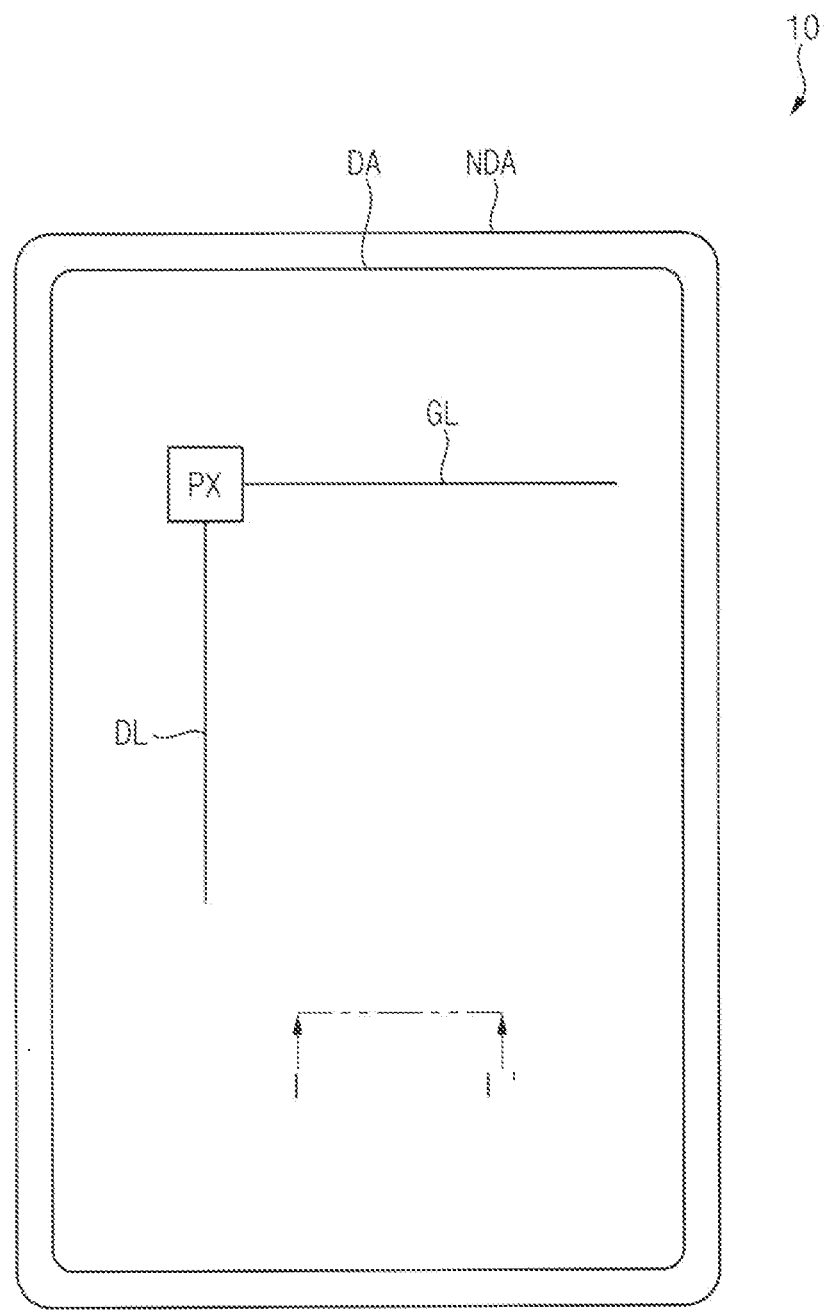
FIG. 1 is a plan view of a display device according to one or more embodiments of the present disclosure.

The present disclosure may be modified in many alternate forms, and thus specific embodiments will be exemplified in the drawing and described in more detail. It should be understood, however, that it is not intended to limit the present disclosure to the particular forms disclosed, but rather, is intended to cover all modifications, equivalents, and alternatives falling within the spirit and scope of the present disclosure.

Hereinafter, display devices in accordance with embodiments will be described in more detail with reference to the accompanying drawings. The same reference numerals are used for the same components in the drawings, and redundant descriptions of the same components may not be provided.

FIG. 1 is a plan view of a display device according to one or more embodiments of the present disclosure.

Referring to FIG. 1, a display device 10 may include a display area DA and a non-display area NDA. The display area DA may be an area for displaying an image. A planar shape (in a plan view) of the display area DA may be a rectangular shape or a rectangular shape with rounded corners as shown in FIG. 1. However, the planar shape of the display area DA is not limited thereto, and the display area DA may have one or more suitable planar shapes such as a circle, an ellipse, and/or a polygon.

The non-display area NDA may be disposed around the display area DA. The non-display area NDA may surround the display area DA. The non-display area NDA may be an area that does not display an image. In one or more embodiments, drivers for displaying an image in the display area DA may be disposed in the non-display area NDA.

Pixels PX may be arranged in a matrix in the display area DA. Signal lines such as a gate line GL and a data line DL may be disposed in the display area DA. The signal lines such as the gate line GL and the data line DL may be connected to each of the pixels PX. Each of the pixels PX may receive a gate signal, a data signal, and/or the like from the signal lines.

Figure 2:
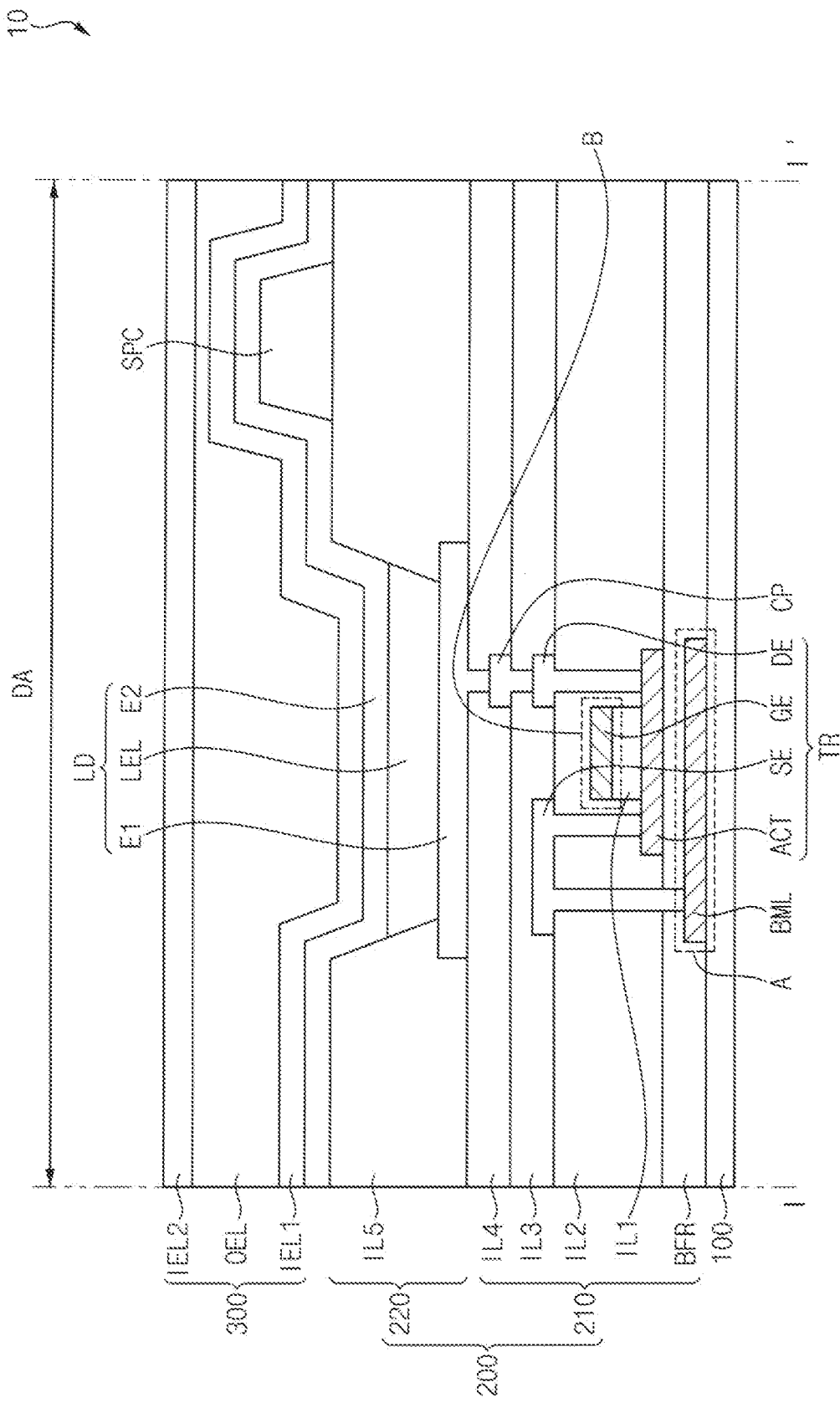
FIG. 2 is a cross-sectional view taken along line I-I' of FIG. 1, according to one or more embodiments of the present disclosure.

FIG. 2 is a cross-sectional view taken along line I-I' of FIG. 1, according to one or more embodiments of the present disclosure.

Referring to FIGS. 1 and 2, the display device 10 may include a substrate 100, a display element layer 200, and an encapsulation layer 300. The display element layer 200 may include a circuit element layer 210 and a light emitting element layer 220.

The circuit element layer 210 may be disposed on the substrate 100, and include a metal pattern BML, a buffer layer BFR, at least one transistor TR, a gate line GL, a connection electrode CP, and a first insulation layer IL1, a second insulation layer IL2, a third insulation layer IL3, and a fourth insulation layer IL4. The transistor TR may include an active layer ACT, a gate electrode GE, a source electrode SE, and a drain electrode DE. The light emitting element layer 220 may be disposed on the circuit element layer 210, and may include a fifth insulation layer IL5, a spacer SPC, and a light emitting diode LD. The light emitting diode LD may include a first electrode E1, a light emitting layer LEL, and a second electrode E2.

The substrate 100 may support the display element layer 200. The substrate 100 may be a base substrate or a base member, and may be made of an insulating material such as a polymer resin. For example, the substrate 100 may be a flexible substrate capable of bending, folding, rolling, and/or the like. As another example, the substrate 100 may include a flexible material and a rigid material.

The metal pattern BML may be disposed on the substrate 100.

The buffer layer BFR may be disposed on the substrate 100. The buffer layer BFR may cover the metal pattern BML. The metal pattern BML and the buffer layer BFR may prevent or reduce the diffusion of metal atoms or impurities from the substrate 100 into the active layer ACT.

The active layer ACT may be disposed on the substrate 100. The active layer ACT may overlap the metal pattern BML. The active layer ACT may be divided into a source region and a drain region doped with impurities, and a channel region between the source region and the drain region.

The active layer ACT may include an oxide semiconductor. As an example of the oxide semiconductor, a single metal oxide such as indium oxide (In), tin oxide (Sn), or zinc oxide (Zn), a binary metal oxide such as an In—Zn-based oxide, a Sn—Zn-based oxide, an Al—Zn-based oxide, a Zn—Mg-based oxide, a Sn—Mg-based oxide, an In—Mg-based oxide or In—Ga-based oxide, a ternary metal oxide such as an In—Ga—Zn-based oxide, an In—Al—Zn-based oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide or In—Lu—Zn-based oxide, and/or a quaternary metal oxide such as an In—Sn—Ga—Zn-based oxides, an In—Hf—Ga—Zn-based oxides, an In—Al—Ga—Zn-based oxides, an In—Sn—Al—Zn-based oxides, an In—Sn—Hf—Zn-based oxide or an In—Hf—Al—Zn-based oxide, may be utilized. These substances may be utilized alone or in combination. For example, the active layer ACT may include Indium-Gallium-Zinc Oxide (IGZO) among the In—Ga—Zn-based oxides.

The first insulation layer IL1 may be disposed on the active layer ACT. The first insulation layer IL1 may overlap the active layer ACT and have an island shape. However, the present disclosure is not limited thereto. For example, the first insulation layer IL1 may include an inorganic material.

A gate layer including the gate line GL and the gate electrode GE may be disposed on the first insulation layer IL1. In one or more embodiments, the gate electrode GE may overlap the channel region of the active layer ACT. However, the present disclosure is not limited thereto, and the gate electrode GE may be a portion of the gate line GL. Accordingly, the material forming the gate electrode GE and the thickness of the gate electrode GE may be the same as those of the gate line GL.

The second insulation layer IL2 may be disposed on the buffer layer BFR and the active layer ACT. In one or more embodiments, the second insulation layer IL2 may cover the active layer ACT, the first insulation layer IL1, and the gate electrode GE, and may be disposed to have substantially the same thickness along a profile of the active layer ACT, the first insulation layer IL1 and the gate electrode GE. However, the present disclosure is not limited thereto.

The source electrode SE and the drain electrode DE may be disposed on the second insulation layer IL2. The source electrode SE may contact the metal pattern BML through a first contact hole formed in the buffer layer BFR and second insulation layer IL2. Also, the source electrode SE may contact the source region of the active layer ACT through a second contact hole formed in the second insulation layer IL2. The drain electrode DE may contact the drain region of the active layer ACT through a third contact hole formed in the second insulation layer IL2. However, the present disclosure is not limited thereto. In one or more embodiments, the drain electrode DE may contact the metal pattern BML through a first contact hole formed in the buffer layer BFR and second insulation layer IL2, and contact the active layer ACT through a second contact hole formed in the insulation layer IL2. In one or more embodiments, the source electrode SE may contact the active layer ACT through a third contact hole formed in the second insulation layer IL2.

The third insulation layer IL3 may be disposed on the second insulation layer IL2. In one or more embodiments, the third insulation layer IL3 may cover the source and drain electrodes SE and DE, and have a substantially flat top surface without creating a step around the source and drain electrodes SE and DE. For example, the third insulation layer IL3 may include an organic material.

The connection electrode CP may be disposed on the third insulation layer IL3. The connection electrode CP may contact the source electrode SE or the drain electrode DE through a fourth contact hole formed in the third insulation layer IL3.

The fourth insulation layer IL4 may be disposed on the third insulation layer IL3. In one or more embodiments, the fourth insulation layer IL4 may cover the connection electrode CP, and may have a substantially flat top surface without creating a step difference around the source and drain electrodes SE and DE. For example, the fourth insulation layer IL4 may include an organic material.

The first electrode E1 may be disposed on the fourth insulation layer IL4. The first electrode E1 may have reflective or transmissive properties. For example, the first electrode E1 may include a metal.

The first electrode E1 may contact the connection electrode CP through a fifth contact hole formed in the fourth insulation layer IL4. Through this, the first electrode E1 may be connected to the transistor TR.

The fifth insulation layer IL5 may be disposed on the fourth insulation layer IL4, and an opening exposing the top surface of the first electrode E1 may be defined in the fifth insulation layer IL5. For example, the fifth insulation layer IL5 may include an organic material or an inorganic material.

The spacer SPC may be disposed on the fifth insulation layer IL5. For example, the spacer SPC may include an organic material or an inorganic material. The spacer SPC may maintain a gap between the encapsulation layer 300 and the substrate 100.

The spacer SPC may include a material different from that of the fifth insulation layer IL5. The spacer SPC may be formed after the fifth insulation layer IL5 is formed. However, the present disclosure are not limited thereto, and the spacer SPC may include the same material as the fifth insulation layer IL5. Also, the fifth insulation layer IL5 and the spacer SPC may be concurrently (e.g., simultaneously) formed utilizing a halftone mask.

The light emitting layer LEL may be disposed on the first electrode E1. The light emitting layer LEL may be disposed in the opening formed in the fifth insulation layer IL5. In one or more embodiments, the light emitting layer LEL may have a multilayer structure including a hole injection layer, a hole transport layer, an organic emission layer, an electron transport layer, and an electron injection layer. The organic light emitting layer may include a light emitting material.

The second electrode E2 may cover the light emitting layer LEL and may be disposed on the fifth insulation layer IL5 and the spacer SPC. In one or more embodiments, the second electrode E2 may have a plate shape. In one or more embodiments, the second electrode E2 may have transmissive or reflective properties. For example, the second electrode E2 may include a metal.

The encapsulation layer 300 may prevent or substantially prevent moisture and oxygen from penetrating into the light emitting diode LD from the outside. For example, the encapsulation layer 300 may include a first inorganic encapsulation layer IEL1, an organic encapsulation layer OEL, and a second inorganic encapsulation layer IEL2.

The first inorganic encapsulation layer IEL1 may be disposed on the second electrode E2 to have substantially the same thickness along a profile of the second electrode E2. The organic encapsulation layer OEL may be disposed on the first inorganic encapsulation layer IEL1, and may have a substantially flat top surface without creating a step around the first inorganic encapsulation layer IEL1. The second inorganic encapsulation layer IEL2 may be disposed on the organic encapsulation layer OEL.

Figure 3:
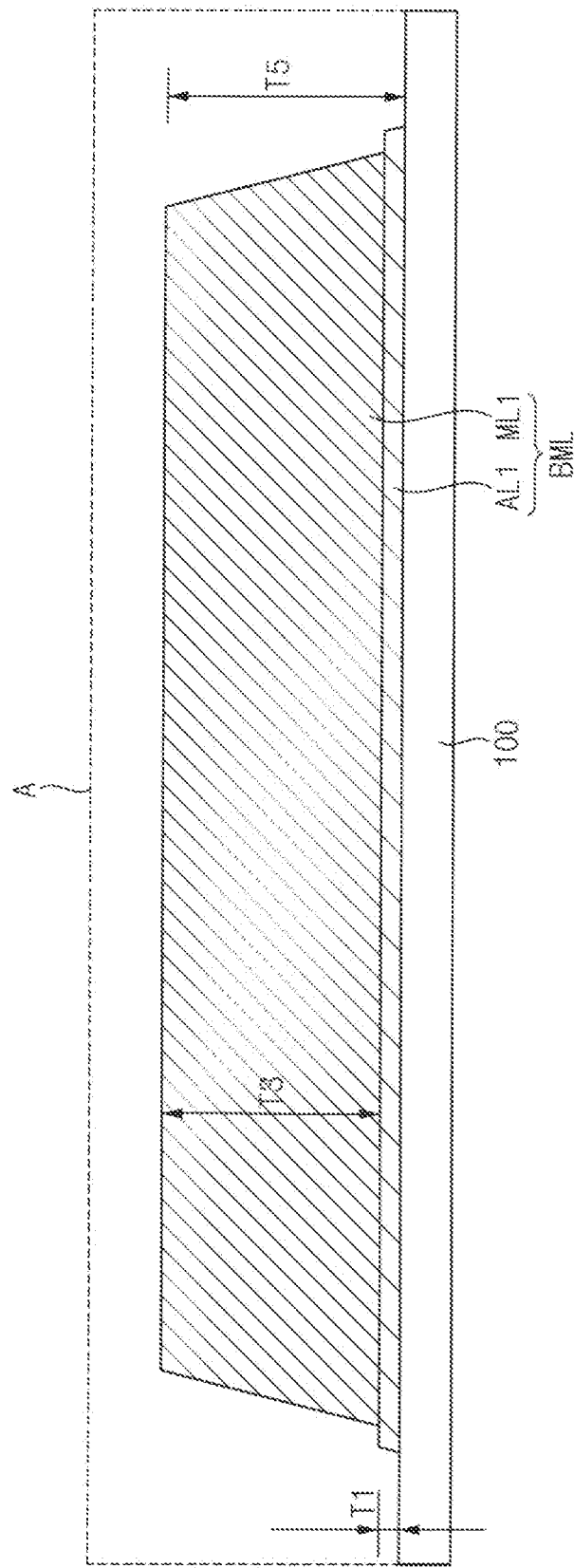
FIG. 3 is an enlarged cross-sectional view of area A of FIG. 2, according to one or more embodiments of the present disclosure.
Figure 4:
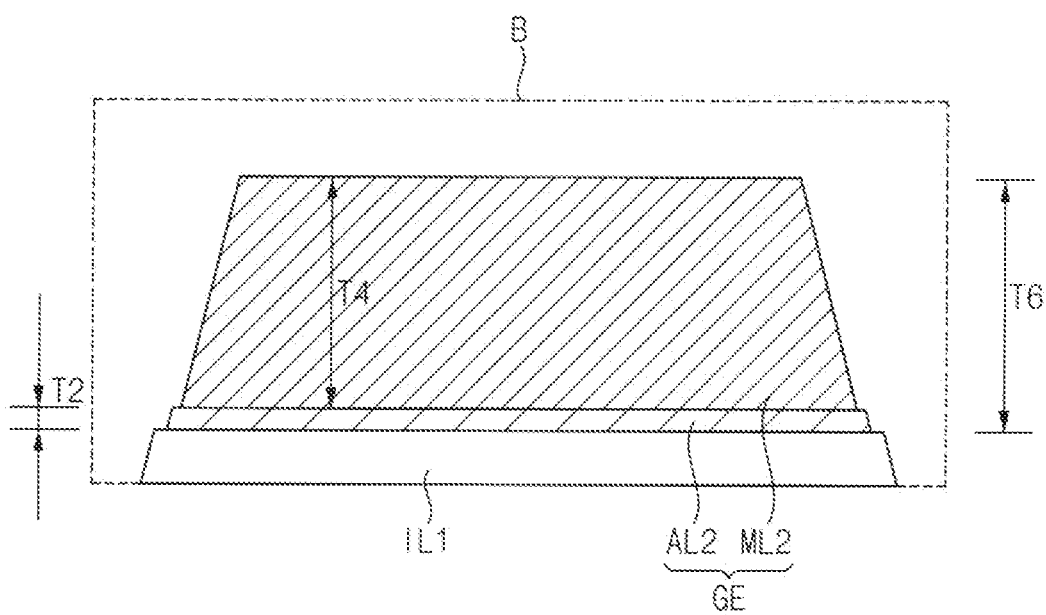
FIG. 4 is an enlarged cross-sectional view of area B of FIG. 2, according to one or more embodiments of the present disclosure.

FIG. 3 is an enlarged cross-sectional view of area A of FIG. 2, according to one or more embodiments of the present disclosure. FIG. 4 is an enlarged cross-sectional view of area B of FIG. 2, according to one or more embodiments of the present disclosure.

For example, FIG. 3 is a cross-sectional view illustrating the metal pattern BML, and FIG. 4 is a cross-sectional view illustrating the gate electrode GE.

Referring to FIGS. 1 to 4, the metal pattern BML may include a first alloy layer AU and a first metal layer ML1. The first alloy layer AL1 may be disposed on the substrate 100, and the first metal layer ML1 may be disposed on the first alloy layer AL1.

Each of the gate electrode GE and the gate line GL may include a second alloy layer AL2 and a second metal layer ML2. The second alloy layer AL2 may be disposed on the first insulation layer IL1, and the second metal layer ML2 may be disposed on the second alloy layer AL2. Hereinafter, the gate electrode GE may be mainly described.

The first metal layer ML1 and the second metal layer ML2 may include copper. The first metal layer ML1 and the second metal layer ML2 may include the same material.

The first alloy layer AL1 may include a titanium alloy. The titanium alloy may include titanium (Ti), and at least one of copper (Cu) and/or zinc (Zn).

Similarly, the second alloy layer AL2 may include a titanium alloy. The titanium alloy may include titanium and may include at least one of copper and/or zinc.

For example, each of the first alloy layer AL1 and the second alloy layer AL2 may include a titanium alloy including titanium and copper. However, the present disclosure is not limited thereto, and each of the first alloy layer AU and the second alloy layer AL2 may include a titanium alloy including titanium and zinc.

In one or more embodiments, the first alloy layer AL1 and the second alloy layer AL2 may include the same material. However, the present disclosure is not limited thereto, and the first alloy layer AL1 and the second alloy layer AL2 may include different materials.

For example, the first alloy layer AL1 and the second alloy layer AL2 may include the same titanium alloy. The titanium alloy may include titanium and copper. A content (e.g., amount) of titanium included in the titanium alloy may be about 10 at % to about 80 at %. A content (e.g., amount) of copper included in the titanium alloy may be about 20 at % to about 90 at %.

The second alloy layer AL2 including titanium may prevent or substantially prevent hydrogen from diffusing from the second insulation layer IL2 to the active layer ACT. In one or more embodiments, the first alloy layer AL1 including titanium may prevent or substantially prevent hydrogen from diffusing from the substrate 100 to the active layer ACT. For example, each of the first alloy layer AL1 and the second alloy layer AL2 may serve as a hydrogen barrier.

When the content (e.g., amount) of titanium included in the titanium alloy is about 10 at % or less, each of the first alloy layer AL1 and the second alloy layer AL2 may not properly function as the hydrogen barrier.

When the content (e.g., amount) of copper included in the titanium alloy is about 20 at % or less, the difference between an etching rate of the titanium alloy and an etching rate of the copper increases, so that a skew (e.g., skew SK1 of FIG. 13) may increase when etching the first alloy layer AU and the first metal layer ML1. The skew refers to a distance between the end of the photoresist pattern (see, e.g., FIG. 13) and the end of the metal pattern BML. Accordingly, it may be difficult to control a width of the metal pattern BML when the first alloy layer AL1 and the first metal layer ML1 are etched.

Similarly, a skew (e.g., skew SK2 of FIG. 21) may increase, when the second alloy layer AL2 and the second metal layer ML2 are etched. The skew refers to a distance between the end of the photoresist pattern (see, e.g., FIG. 21) and the end of the gate electrode GE. Accordingly, it may be difficult to control a width of the gate electrode GE when the second alloy layer AL2 and the second metal layer ML2 are etched.

In one or more embodiments, the content (e.g., amount) of titanium included in the titanium alloy may be about 20 at % to about 50 at %, and the content (e.g., amount) of copper included in the titanium alloy may be about 50 at % to about 80 at %.

When the content (e.g., amount) of titanium included in the titanium alloy is about 20 at % to about 50 at %, and the content (e.g., amount) of copper included in the titanium alloy is about 50 at % to about 80 at %, each of the first alloy layer AU and the second alloy layer AL2 may properly function as the hydrogen barrier. Also, because the difference between the etching rate of the titanium alloy and the etching rate of copper is reduced, the skew may be reduced when the first alloy layer AL1 and the first metal layer ML1 are etched. For example, when the first alloy layer AU and the first metal layer ML1 are etched, the width of the metal pattern BML may be controlled or selected (e.g., easily controlled or selected). Similarly, when the second alloy layer AL2 and the second metal layer ML2 are etched, the skew may be reduced. For example, when the second alloy layer AL2 and the second metal layer ML2 are etched, the width of the gate electrode GE may be controlled or selected (e.g., easily controlled or selected).

Also, in one or more embodiments, each of the first alloy layer AL1 and the second alloy layer AL2 may include a titanium alloy including titanium, copper, and zinc. For example, the titanium alloy may include all of titanium, copper, and zinc.

In the above description, the titanium alloy may include titanium and copper, but the present disclosure is not limited thereto. The same description may be applied to when the titanium alloy includes titanium and zinc, or the titanium alloy include titanium, copper, and zinc.

In one or more embodiments, each of a thickness T1 of the first alloy layer AL1 and a thickness T2 of the second alloy layer AL2 may be between about 30 Å and about 100 Å. The first alloy layer AL1 and the second alloy layer AL2 may have substantially the same thickness. However, the present disclosure is not limited thereto, and the first alloy layer AL1 and the second alloy layer AL2 may have different thicknesses.

When each of the thickness T1 of the first alloy layer AL1 and the thickness T2 of the second alloy layer AL2 is less than about 30 Å, during the manufacturing process it may be difficult to control each of the thickness T1 of the first alloy layer AL1 and the thickness T2 of the second alloy layer AL2. Accordingly, the reliability of the display device 10 may be deteriorated.

When each of the thickness T1 of the first alloy layer AL1 and the thickness T2 of the second alloy layer AL2 is more than about 100 Å, during the manufacturing process when each of the first alloy layer AL1 and the second alloy layer AL2 is etched, it may take a long time to etch. Accordingly, because manufacturing time of the display device 10 increases, manufacturing efficiency may decrease.

In addition, when each of the thickness T1 of the first alloy layer AL1 and the thickness T2 of the second alloy layer AL2 is about 100 Å or more, during heat treatment in high temperatures, thermal diffusion between titanium of each of the first and second alloy layers AL1 and AL2 and copper of each of the first and second metal layers ML1 and ML2 may occur. Accordingly, a diffusion layer due to thermal diffusion between titanium and copper may be formed between the first alloy layer AL1 and the first metal layer ML1 and between the second alloy layer AL2 and the second metal layer ML2. As each of the thickness T1 of the first alloy layer AL1 and the thickness T2 of the second alloy layer AL2 increases, the diffusion layer due to the thermal diffusion may become thicker. In addition, as the diffusion layer becomes thicker, the resistance of each of the metal pattern BML and the gate electrode GE may increase.

In one or more embodiments, each of a thickness T3 of the first metal layer ML1 and a thickness T4 of the second metal layer ML2 may be between about 1500 Å and about 4500 Å. The first metal layer ML1 and the second metal layer ML2 may have substantially the same thickness. However, the present disclosure is not limited thereto, and the first metal layer ML1 and the second metal layer ML2 may have different thicknesses.

When each of the thickness T3 of the first metal layer ML1 and the thickness T4 of the second metal layer ML2 is less than about 1500 Å, resistance of the first metal layer ML1 and the second metal layer ML2, respectively, may increase.

When each of the thickness T3 of the first metal layer ML1 and the thickness T4 of the second metal layer ML2 is more than about 4500 Å, each of the first metal layer ML1 and the second metal layer ML2 may affect layers disposed on each of the first metal layer ML1 and the second metal layer ML2 in the stacked structure of the display device 10. Accordingly, due to this, a defect may occur in the display device 10.

In one or more embodiments, the first alloy layer AL1 and the second alloy layer AL2 include the same material, and the first metal layer ML1 and the second metal layer ML2 include the same material, thus the metal pattern BML may include substantially the same material as the gate electrode GE.

Also, a thickness T5 of the metal pattern BML may be substantially the same as a thickness T6 of the gate electrode GE.

The metal pattern BML and the gate electrode GE may be connected to the gate line GL. In this case, as the metal pattern BML includes substantially the same material as the gate electrode GE and the gate line GL, and the thickness T5 of the metal pattern BML, the thickness T6 of the gate electrode GE, and a thickness of the gate line GL are substantially the same, the metal pattern BML, the gate electrode GE, and the gate line may have substantially the same resistance. Accordingly, signal transmission through the gate line GL may be facilitated. Also, because the metal pattern BML, the gate electrode GE, and the gate line GL are formed of the same material and the same thickness, compatibility may be improved. Accordingly, it may be easy to manufacture the metal pattern BML, the gate electrode GE, and the gate line GL during the manufacturing process of the display device 10.

In one or more embodiments, as the metal pattern BML included in the display device 10 includes the first alloy layer AL1 including the titanium alloy, and the gate electrode GE includes the second alloy layer AL2 including the titanium alloy, the width of each of the metal pattern BML and the gate electrode GE may be controlled or selected (e.g., easily controlled or selected). Accordingly, a fine line width of each of the metal pattern BML and the gate electrode GE included in the display device 10 may be realized. In one or more embodiments, the metal pattern BML and the gate electrode GE prevent or substantially prevent hydrogen from diffusing into the active layer ACT, thereby improving the performance of the transistor TR. Accordingly, a high resolution may be realized and display quality may be improved in the display device including the metal pattern BML and the gate electrode GE.

In one or more embodiments, because each of the first metal layer ML1 and the second metal layer ML2 includes copper, the resistance of the electrode and the wiring including the first metal layer ML1 and the second metal layer ML2 may be reduced.

Hereinafter, the effects of embodiments of the present disclosure will be described.

Figure 5A:
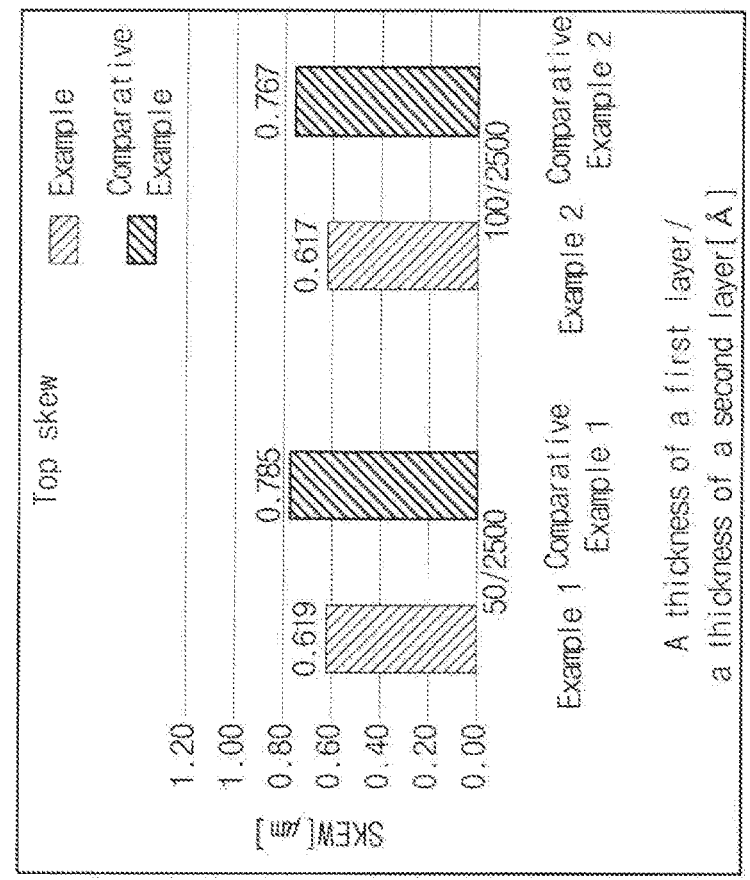
FIG. 5A is a graph illustrating bottom skew according to a thickness of the wiring for the wiring according to Examples and Comparative Examples.
Figure 5B:
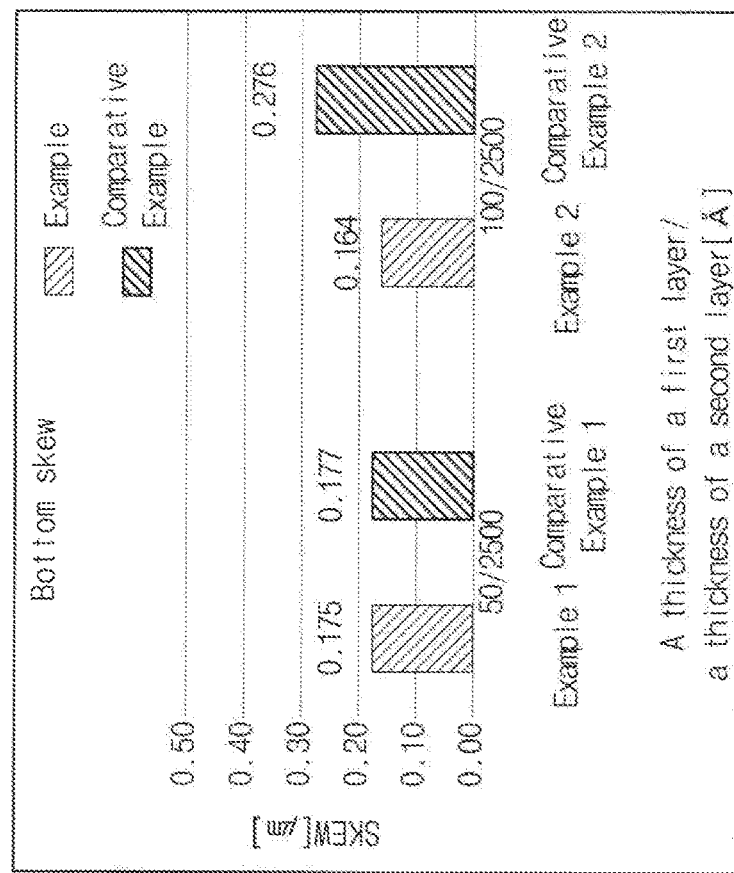
FIG. 5B is a graph illustrating top skew according to the thickness of the wiring for the wiring according to Examples and Comparative Examples.

FIG. 5A is a graph illustrating bottom skew according to a thickness of the wiring for the wiring according to Examples and Comparative Examples. FIG. 5B is a graph illustrating top skew according to the thickness of the wiring for the wiring according to Examples and Comparative Examples.

Example 1 and Example 2, Comparative Example 1 and Comparative Example 2

According to Examples 1 and 2, a first layer (e.g., the first alloy layer AL1 of FIG. 3 or the second alloy layer of FIG. 4) including about 50 at % titanium and about 50 at % copper and a second layer (e.g., the first metal layer ML1 of FIG. 3 or the second metal layer ML2 of FIG. 4) including copper on the first layer were prepared, and then the first layer and the second layer were wet-etched to prepare wiring. According to Comparative Examples 1 and 2, a first layer including titanium and a second layer including copper were prepared, and then the first layer and the second layer were wet-etched to prepare wiring. A thickness of the first layer and a thickness of the second layer according to each of Examples and Comparative Examples are shown in Table 1.

TABLE 1

| | Thickness of first layer (Å) | Thickness of second layer (Å) |
|---|---|---|
| Example 1 | 50 | 2500 |
| Example 2 | 100 | 2500 |
| Comparative Example 1 | 50 | 2500 |
| Comparative Example 2 | 100 | 2500 |

Referring to Table 1, FIG. 5A, and FIG. 5B, under the same conditions as described above, in the Examples and the Comparative Examples, skew according to the thickness of the first layer and the thickness of the second layer was measured. Here, the skew refers to a distance between an end of a photoresist pattern and an end of a bottom surface of the second layer in FIG. 5A, and refers to a distance (e.g., the skew SK1 of FIG. 13 and the skew SK2 of FIG. 21) between an end of the photoresist pattern and an end of a top surface of the second layer in FIG. 5B.

As shown in FIG. 5A, when the thickness of the first layer according to the Examples and the thickness of the first layer according to the Comparative Examples are the same, it can be seen that the skew of the bottom surface of the second layer satisfying the Examples is relatively small compared to the skew of the bottom surface of the second layer satisfying the Comparative Examples.

Similarly, as shown in FIG. 5B, when the thickness of the first layer according to the Examples and the thickness of the first layer according to the Comparative Examples are the same, it can be seen that the skew of the top surface of the second layer satisfying the Examples is relatively small compared to the skew of the top surface of the second layer satisfying the Comparative Examples.

Through these results, it can be seen that when the display device according to one or more embodiments includes the first layer including the titanium-copper alloy, the skew of the second layer is reduced. Accordingly, it can be seen that it is relatively easy to control the width of the wiring of Examples 1 and 2 compared to the wiring of Comparative Examples 1 and 2.

Example 1 and Example 2, Comparative Example 3 and Comparative Example 4

According to Examples 1 and 2, and Comparative Examples 3 and 4, a first layer including about 50 at % titanium and about 50 at % copper and a second layer including copper on the first layer are prepared, and then the first layer and the second layer were wet-etched to prepare a wiring. The thickness of the first layer, the thickness of the second layer, and the width of the top surface of the second layer according to each of the Examples and the Comparative Examples are shown in Table 2.

TABLE 2

|  | A thickness of a first layer (Å) | A thickness of a second layer (Å) | A width of a top surface of a second layer (µm) |
|---|---|---|---|
| Example 1 | 50 | 2500 | 1.79 |
| Example 2 | 100 | 2500 | 1.64 |
| Comparative Example 3 | 200 | 2500 | 1.43 |
| Comparative Example 4 | 300 | 2500 | 1.31 |

Referring to Table 2, under the same conditions as described above, in the Examples and the Comparative Examples, the width of the top surface of the second layer according to the thickness of the first layer and the thickness of the second layer was measured.

As shown in Table 2, as the thickness of the first layer according to the Examples and Comparative Examples increases, it can be seen that the width of the top surface of the second layer of Examples 1 and 2 is relatively large compared to the width of the top surface of the second layer of Comparative Examples 3 and 4.

Through these results, it can be seen that as the thickness of the first layer included in the display device according to one or more embodiments of the present disclosure decreases, the width of the top surface of the second layer decreases relatively less. For example, it can be seen that the skew decreases as the thickness of the first layer decreases. Accordingly, it can be seen that it is relatively easy to control the width of the wiring of Examples 1 and 2 compared to the wiring of Comparative Examples 3 and 4.

Figure 6:
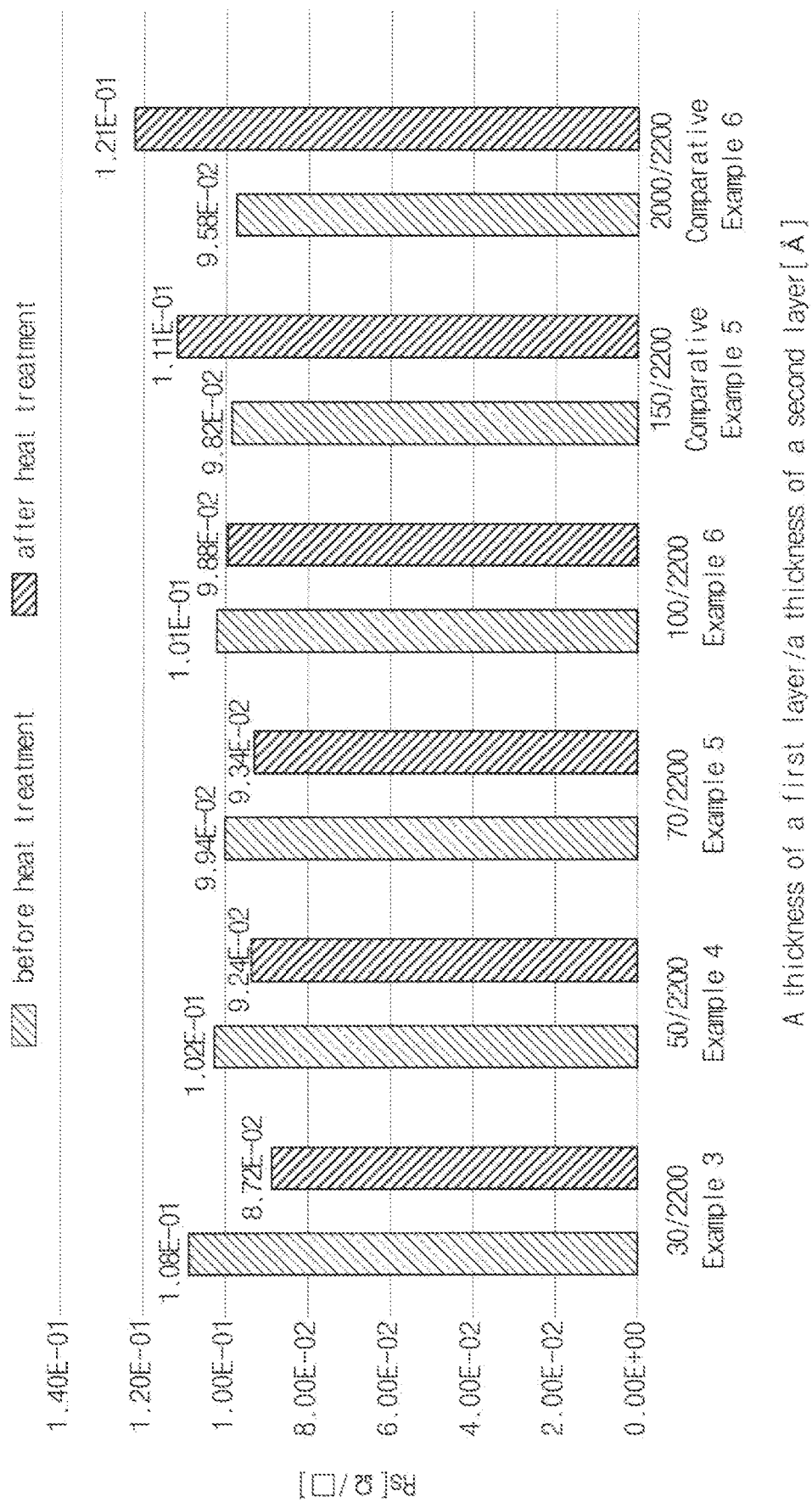
FIG. 6 is a graph illustrating sheet resistance values of wirings according to the thickness of the wiring according to Examples and Comparative Examples.

FIG. 6 is a graph illustrating sheet resistance values of wirings based on the thickness of the wiring according to Examples and Comparative Examples.

Examples 3 to 6, Comparative Examples 5 and 6

According to Examples 3-6, and Comparative Examples 5 and 6, a first layer including about 50 at % titanium and about 50 at % copper and a second layer including copper on the first layer were prepared, and then the first layer and the second layer were heat-treated at 400° C. for 1 hour to prepare a wiring. The thickness of the first layer and the thickness of the second layer according to each of Examples and Comparative Examples are shown in Table 3.

TABLE 3

|  | A thickness of a first layer (Å) | A thickness of a second layer (Å) |
|---|---|---|
| Example 3 | 30 | 2200 |
| Example 4 | 50 | 2200 |
| Example 5 | 70 | 2200 |
| Example 6 | 100 | 2200 |
| Comparative Example 5 | 150 | 2200 |
| Comparative Example 6 | 200 | 2200 |

Referring to Table 3 and FIG. 6, under the same conditions as described above, in the Examples and the Comparative Examples, the sheet resistance before and after the heat treatment of the wiring according to the thickness of the first layer and the thickness of the second layer were measured.

As shown in Tables 3 and 6, as the thickness of the first layer according to one or more embodiments increases, it can be seen that the sheet resistance value after the heat treatment of the wiring satisfying each of Examples 3 to 6 is less than or substantially the same as the sheet resistance value before the heat treatment of the wiring. In contrast, as the thickness of the first layer according to the Comparative Examples increase, it can be seen that the sheet resistance value after heat treatment of the wiring of Comparative Examples 5 and 6 is greater than the sheet resistance value before the heat treatment of the wiring.

Figure 7:
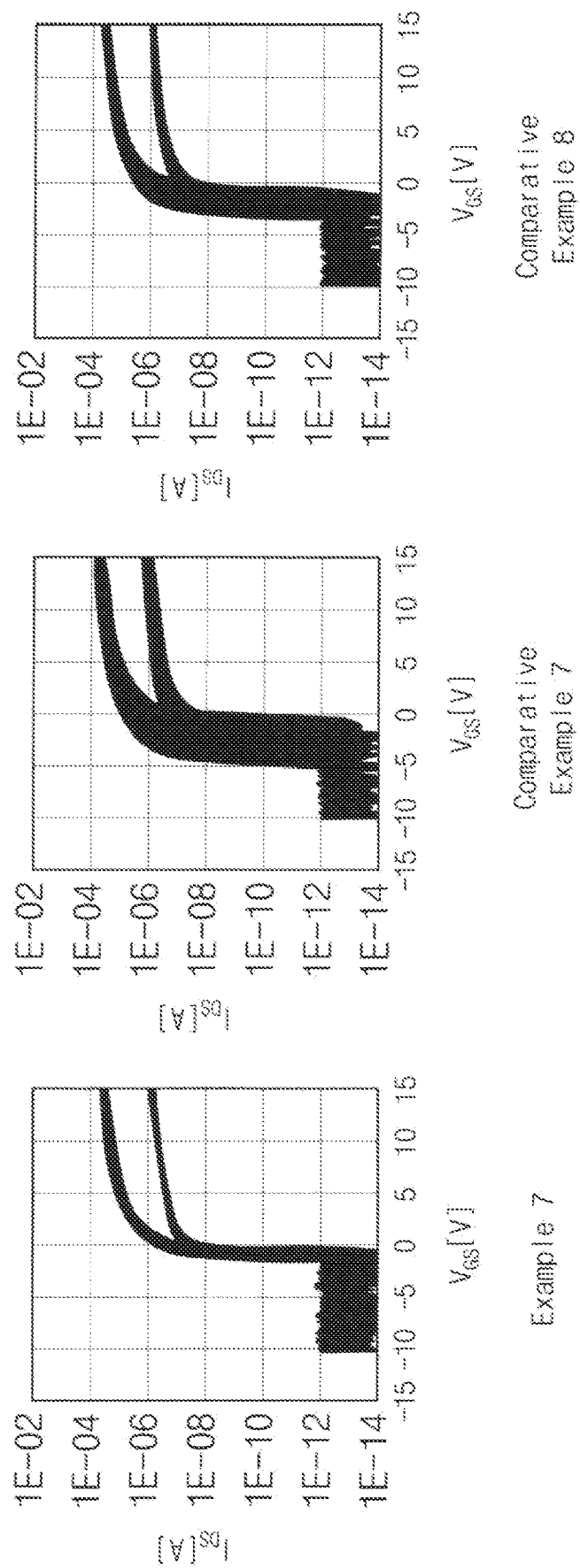
FIG. 7 is a graph illustrating driving currents according to gate-source voltages of transistors according to Examples and Comparative Examples.

Through these results, it can be seen that as the thickness of the first layer included in the display device according to one or more embodiments of the present disclosure decreases, the sheet resistance value after the heat treatment of the wiring is relatively reduced. Accordingly, it can be seen that the wiring of Examples 3 to 6 has a relatively small resistance compared to the wiring of Comparative Examples 5 and 6. FIG. 7 is a graph illustrating driving currents (lips) according to gate-source voltages ($V_{GS}$) of transistors according to Examples and Comparative Examples.

Example 7, Comparative Examples 7 and 8

Referring to FIG. 7, according to Example 7, a first layer including about 50 at % titanium and about 50 at % copper and a second layer including copper on the first layer were prepared, and then the first layer and the second layer were wet-etched to prepare a gate electrode, and a transistor including the gate electrode was prepared.

According to Comparative Example 7, a first layer including titanium and a second layer including molybdenum (Mo) on the first layer were prepared, and then the first layer and the second layer were wet-etched to form a gate electrode and a transistor including the gate electrode was prepared.

According to Comparative Example 8, a first layer including titanium and a second layer including copper on the first layer were prepared, and then the first layer and the second layer were wet-etched to form a gate electrode and a transistor including the gate electrode was prepared.

In addition, according to Example 7, Comparative Example 7, and Comparative Example 8, the first layer was formed to a thickness of about 100 Å.

Under the above conditions, in the Examples and the Comparative Examples, the driving current according to the gate-source voltage was measured.

In the driving current of Example 7, it can be seen that a dispersion is smaller than the driving current satisfying Comparative Examples 7 and 8. Through these results, it can be seen that the gate electrode of Example 7 of the present disclosure has improved transistor performance compared to the gate electrode of Comparative Examples 7 and 8.

FIGS. 8 to 26 are cross-sectional views illustrating a method of manufacturing a display device according to one or more embodiments of the present disclosure.

For example, FIGS. 8 to 26 may be views for explaining a method of manufacturing the display device described with reference to FIGS. 1 to 4. Therefore, the overlapping description may not be provided.

Figure 8:
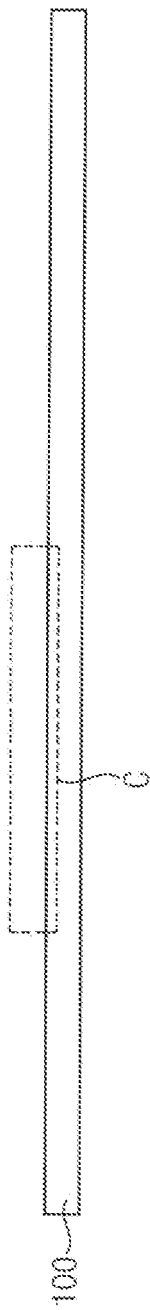
FIGS. 8-26 are cross-sectional views illustrating a method of manufacturing a display device according to one or more embodiments of the present disclosure.
Figure 9:
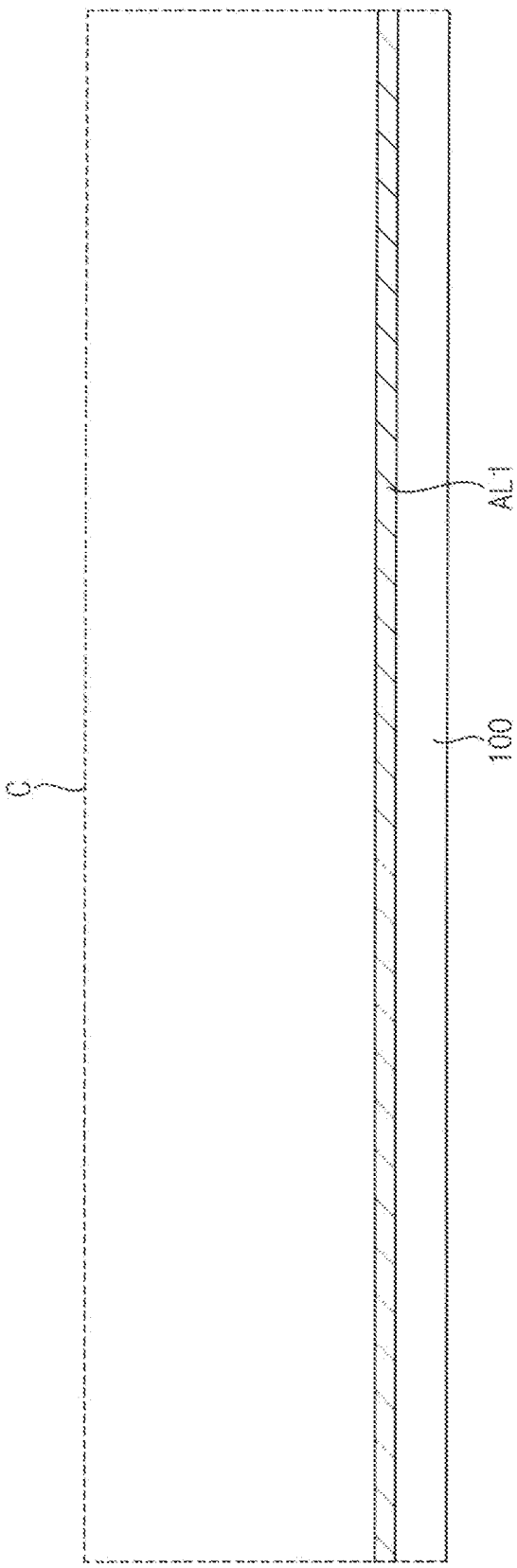
Figure 10:
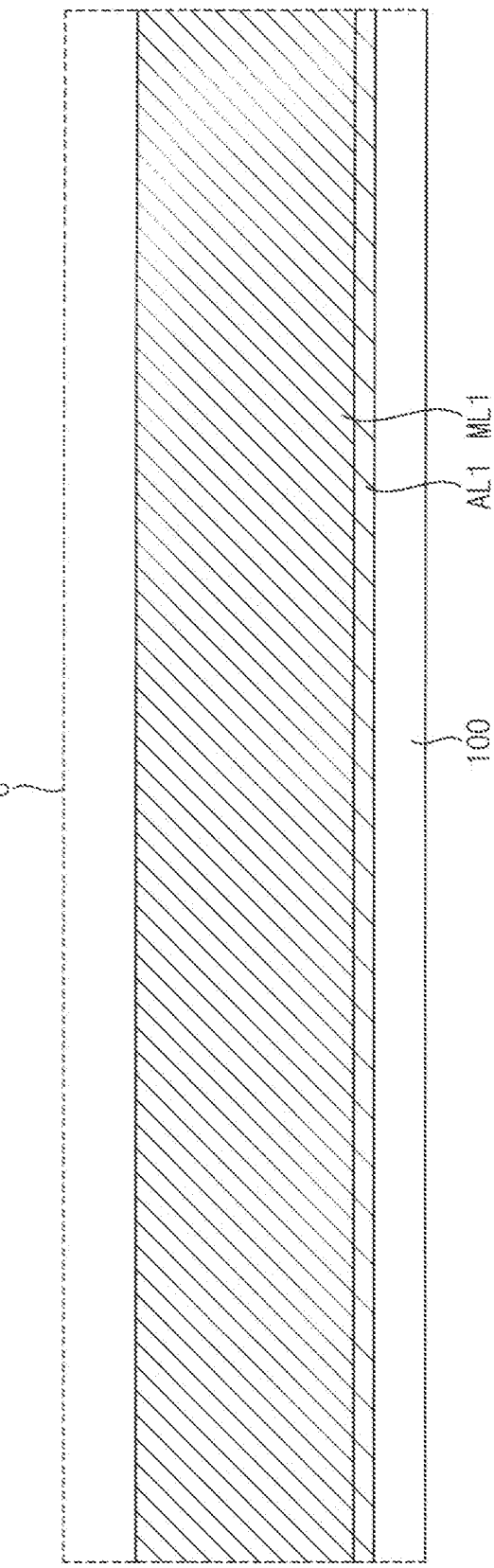

FIGS. 9 and 10 are cross-sectional views illustrating a stacking sequence by enlarging area C of FIG. 8, according to one or more embodiments of the present disclosure.

Referring to FIGS. 8 to 11, a first alloy layer AL1 may be formed on the substrate 100, and a first metal layer ML1 may be formed on the first alloy layer AL1. The first alloy layer AL1 and the first metal layer ML1 may form a raw metal layer BMLa. The first alloy layer AL1 may be formed of a titanium alloy including at least one of copper and/or zinc. The first metal layer ML1 may be formed of copper.

The titanium alloy may be formed of titanium and at least one of copper and/or zinc. For example, the titanium alloy may be formed of titanium and copper.

In one or more embodiments, the content (e.g., amount) of titanium forming the titanium alloy may be about 10 at % to about 80 at %. The content (e.g., amount) of copper forming the titanium alloy may be about 20 at % to about 90 at %.

In one or more embodiments, the content (e.g., amount) of titanium forming the titanium alloy may be about 20 at % to about 50 at %, and the content (e.g., amount) of copper forming the titanium alloy may be about 50 at % to about 80 at %.

Figure 11:
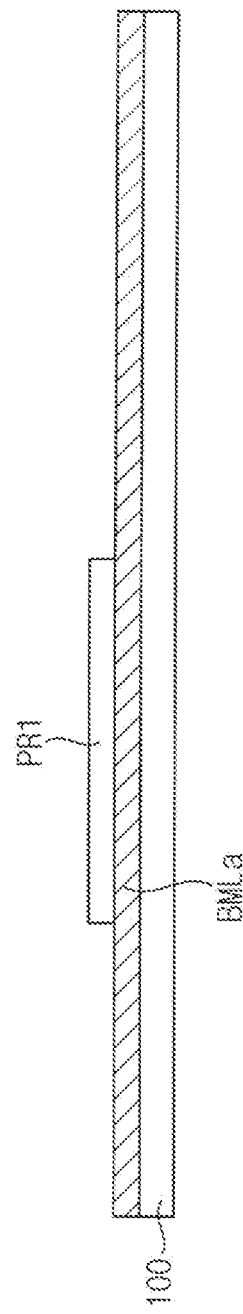
Figure 12:
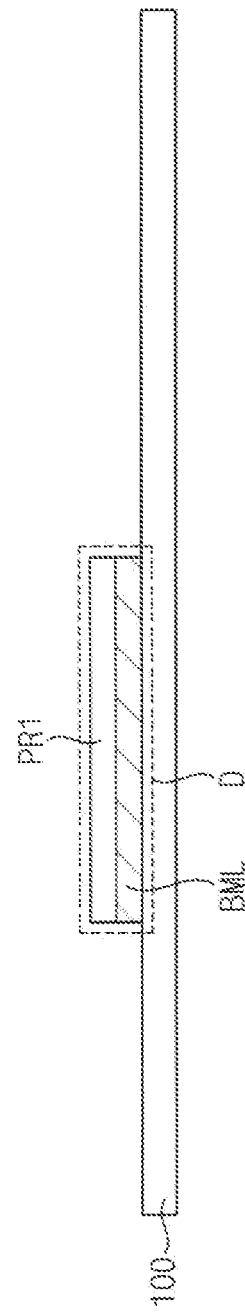

Referring to FIGS. 11 and 12, a first photoresist pattern PR1 may be formed on the raw metal layer BMLa. The first alloy layer AL1 and the first metal layer ML1 may be patterned utilizing the first photoresist pattern PR1. For example, the raw metal layer BMLa may be patterned to form a metal pattern BML.

When the first alloy layer AL1 and the first metal layer ML1 are patterned, the first alloy layer AU and the first metal layer ML1 may be etched utilizing a wet etching technique.

Figure 13:
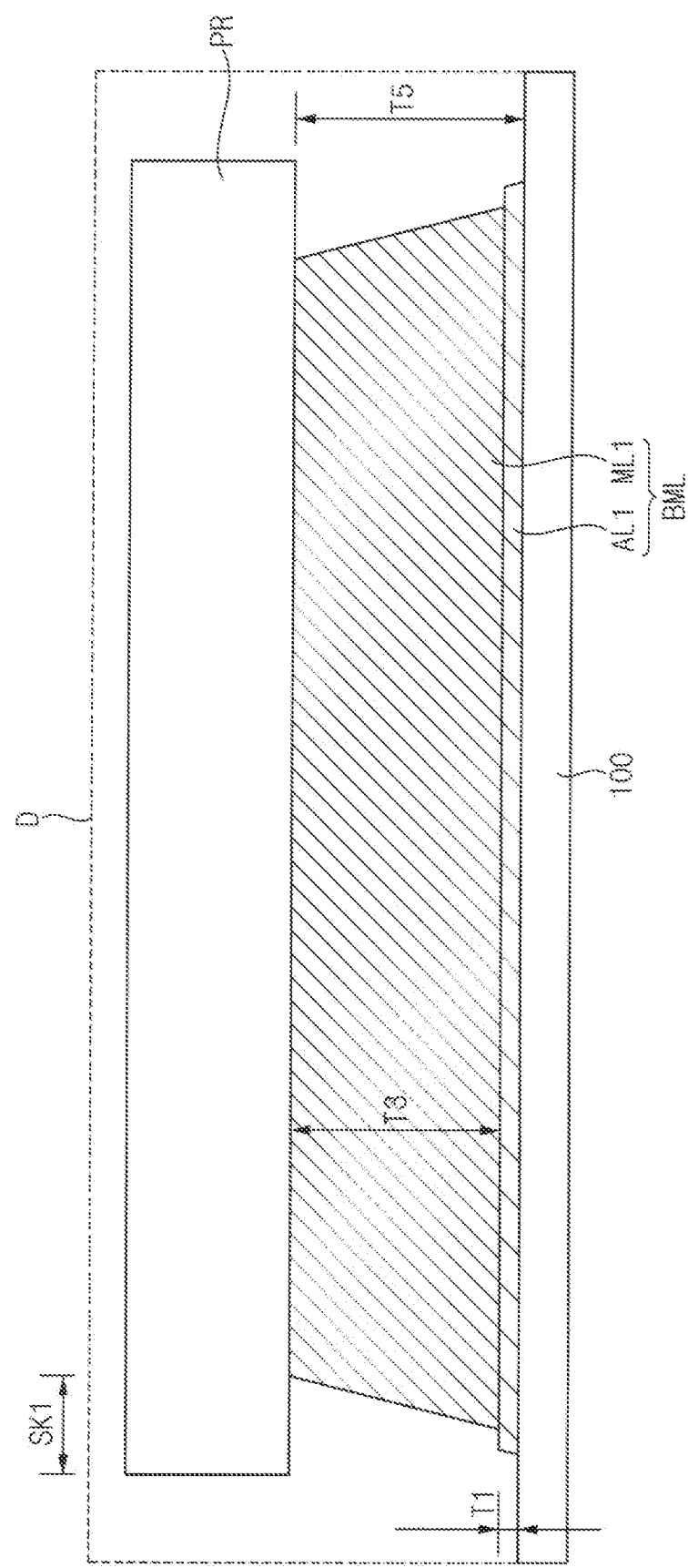

FIG. 13 is an enlarged cross-sectional view of area D of FIG. 12, according to one or more embodiments of the present disclosure.

Referring further to FIG. 13, the thickness T1 of the first alloy layer AL1 may be between about 30 Å and about 100 Å. When the thickness T1 of the first alloy layer AL1 is between about 30 Å and about 100 Å, the width of the metal pattern BML may be controlled or selected (e.g., easily controlled or selected) during a manufacturing process, and an etching time of the first alloy layer AL1 is reduced, so that the manufacturing time of the display device 10 is reduced, and thus manufacturing efficiency may be increased.

Also, the thickness T3 of the first metal layer ML1 may be between about 1500 Å and about 4500 Å. When the thickness T3 of the first metal layer ML1 is between about 1500 Å and about 4500 Å, the first metal layer ML1 may have little influence on the layers disposed on the first metal layer ML1. Also, the resistance of the first metal layer ML1 may be relatively small.

In one or more embodiments, because the first alloy layer AL1 includes the titanium alloy, etching rates of the first metal layer ML1 and the first alloy layer AL1 may be similar to each other. Accordingly, a skew SK1, which is a distance between the end of the first photoresist pattern PR1 and the end of the gate electrode GE (or the gate line GL), may decrease.

After the metal pattern BML is formed, the first photoresist pattern PR1 may be removed.

Figure 14:
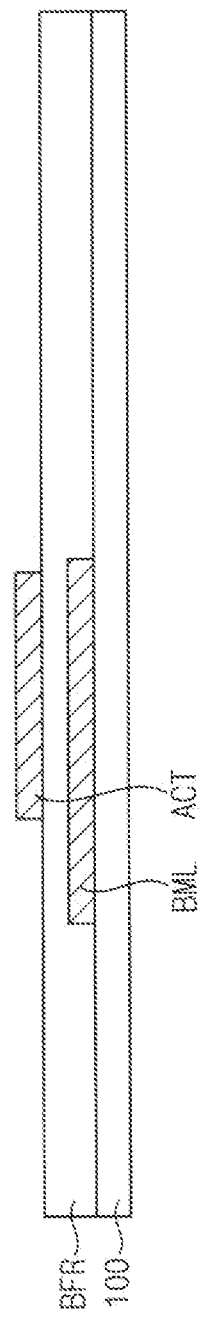
Figure 15:
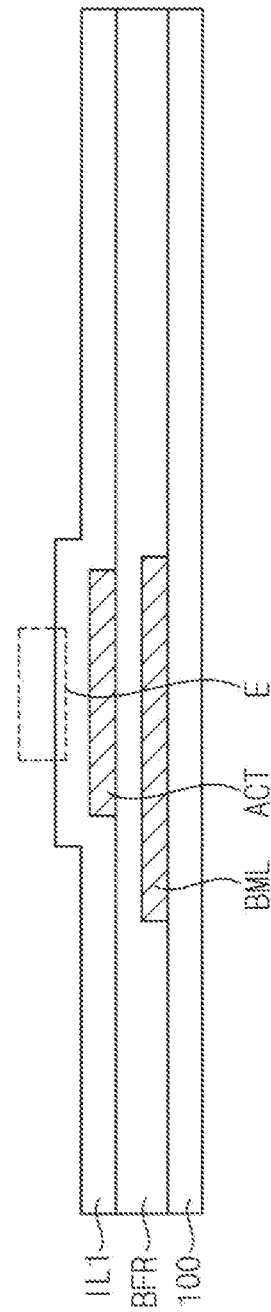

Referring to FIGS. 14 and 15, a buffer layer BFR may be formed on the metal pattern BML. The buffer layer BFR may be formed to cover the metal pattern BML. An active layer ACT may be formed on the buffer layer BFR.

The active layer ACT may be formed of an oxide semiconductor. For example, the active layer ACT may be formed of Indium-Gallium-Zinc Oxide (IGZO).

A first insulation layer IL1 may be formed on the active layer ACT. The first insulation layer IL1 may be formed to cover the active layer ACT.

Figure 16:
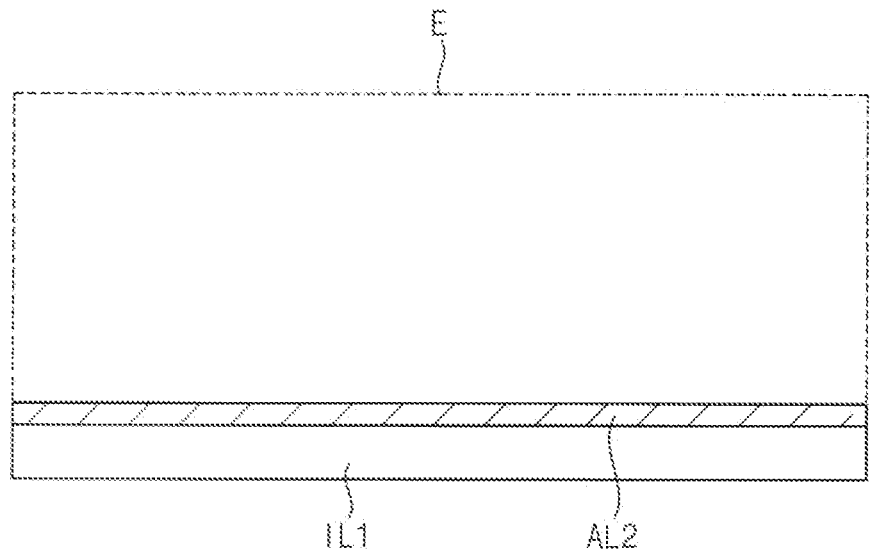
Figure 17:
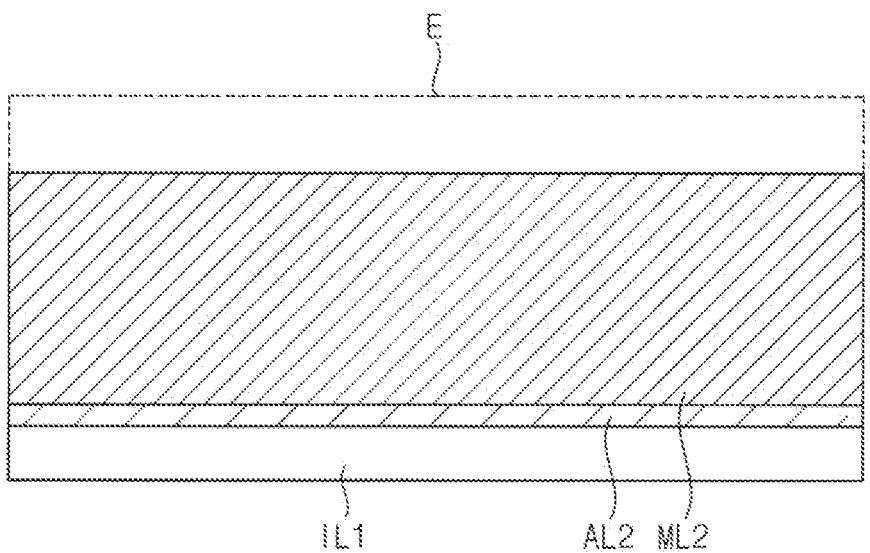

FIGS. 16 and 17 are cross-sectional views illustrating a stacking sequence by enlarging area E of FIG. 15, according to one or more embodiments of the present disclosure.

Referring to FIGS. 15 to 17, a second alloy layer AL2 may be formed on the active layer ACT, and a second metal layer ML2 may be formed on the second alloy layer AL2. The second alloy layer AL2 may be formed of a titanium alloy including at least one of copper and/or zinc. The second metal layer ML2 may be formed of copper. The second alloy layer AL2 and the second metal layer ML2 may form a gate layer GEa.

The titanium alloy may be formed of titanium and at least one of copper and/or zinc. For example, the titanium alloy may be formed of titanium and copper.

In one or more embodiments, the content (e.g., amount) of titanium forming the titanium alloy may be about 10 at % to about 80 at %. The content (e.g., amount) of copper forming the titanium alloy may be about 20 at % to about 90 at %.

In one or more embodiments, the content (e.g., amount) of titanium forming the titanium alloy may be about 20 at % to about 50 at %, and the content (e.g., amount) of copper forming the titanium alloy may be about 50 at % to about 80 at %.

Figure 18:
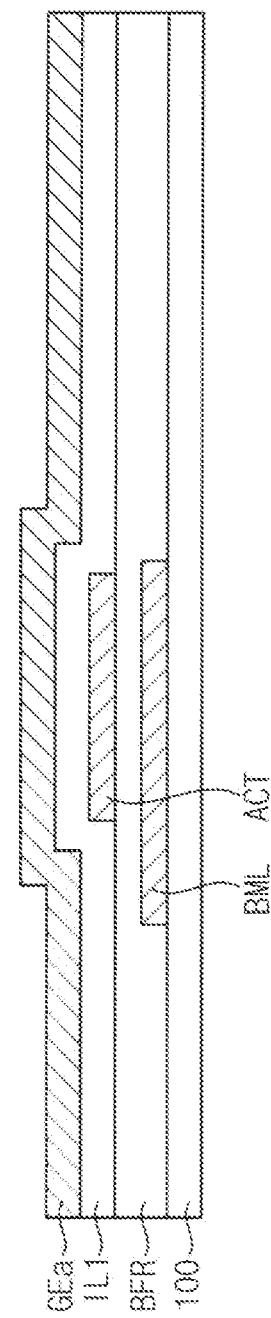
Figure 19:
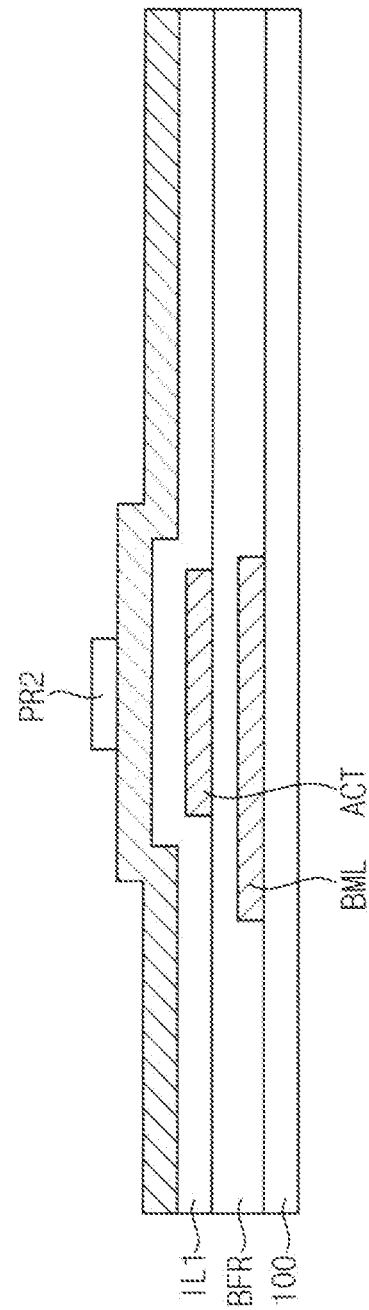
Figure 20:
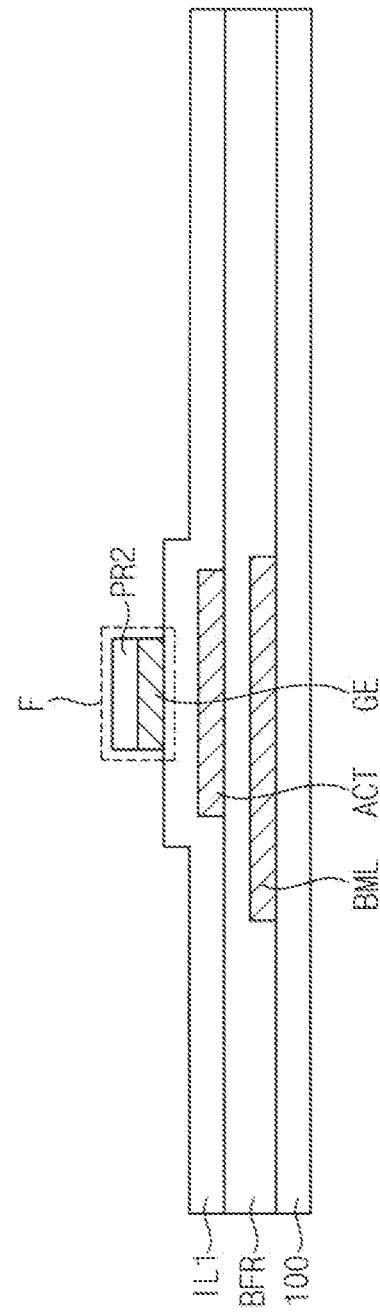

Referring to FIGS. 18 to 20, a second photoresist pattern PR2 may be formed on the gate layer GEa. The second alloy layer AL2 and the second metal layer ML2 may be patterned utilizing the second photoresist pattern PR2. For example, the gate layer GEa may be patterned to form a gate electrode GE and a gate line GL.

When the second alloy layer AL2 and the second metal layer ML2 are patterned, the second alloy layer AL2 and the second metal layer ML2 may be etched utilizing a wet etching technique.

Figure 21:
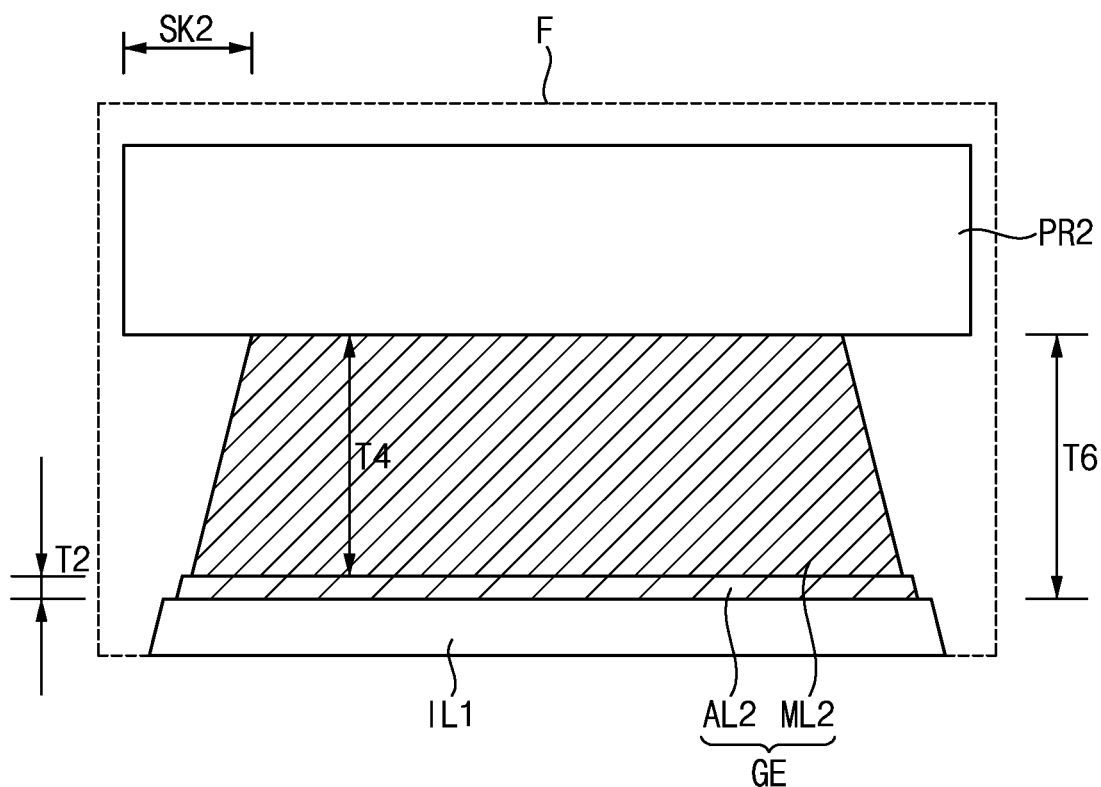

FIG. 21 is an enlarged cross-sectional view of area F of FIG. 20, according to one or more embodiments of the present disclosure.

Referring further to FIG. 21, the thickness T2 of the second alloy layer AL2 may be between about 30 Å and about 100 Å. When the thickness T2 of the second alloy layer AL2 is between about 30 Å and about 100 Å, the width of each of the gate electrode GE and the gate line GL may be controlled or selected (e.g., easily controlled or selected) during a manufacturing process, and the width of the second alloy layer AL2 may be controlled or selected (e.g., easily controlled or selected). Because the etching time of the second alloy layer AL2 is reduced, the manufacturing time of the display device 10 is decreased, and thus manufacturing efficiency may be increased.

Also, the thickness T4 of the second metal layer ML2 may be between about 1500 Å and about 4500 Å. When the thickness T4 of the second metal layer ML2 is between about 1500 Å and about 4500 Å, the second metal layer ML2 may have little effect on the layers disposed on the second metal layer ML2. Also, the resistance of the second metal layer ML2 may be relatively small.

In one or more embodiments, because the second alloy layer AL2 includes the titanium alloy, etching rates of the second metal layer ML2 and the second alloy layer AL2 may be similar to each other. Accordingly, a skew SK2 that is a distance between the end of the second photoresist pattern PR2 and the end of the gate electrode GE (or the gate line GL) may be reduced.

Referring to FIGS. 13 and 21, the thickness T5 of the metal pattern BML and the thickness T6 of the gate electrode GE may be substantially the same as each other. Because the thickness T5 of the metal pattern BML and the thickness T6 of the gate electrode GE are substantially the same, the metal pattern BML and the gate electrode GE may have substantially the same resistance.

After the gate electrode GE and the gate line GL are formed, the second photoresist pattern PR2 may be removed.

Figure 22:
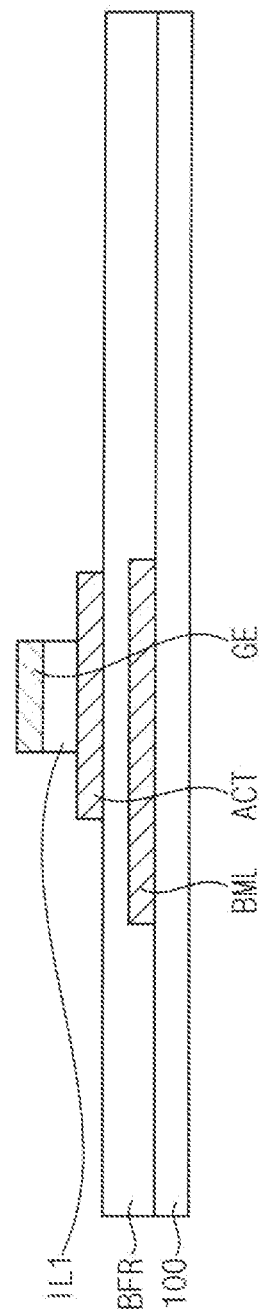

Referring to FIG. 22, the first insulation layer IL1 may be patterned. A portion of the first insulation layer IL1 that does not overlap the gate electrode GE and the gate line GL may be etched. Accordingly, the first insulation layer IL1 may overlap the gate electrode GE and the gate line GL. However, the present disclosure is not limited thereto, and the first insulation layer IL1 may be entirely formed on the buffer layer BFR.

Figure 23:
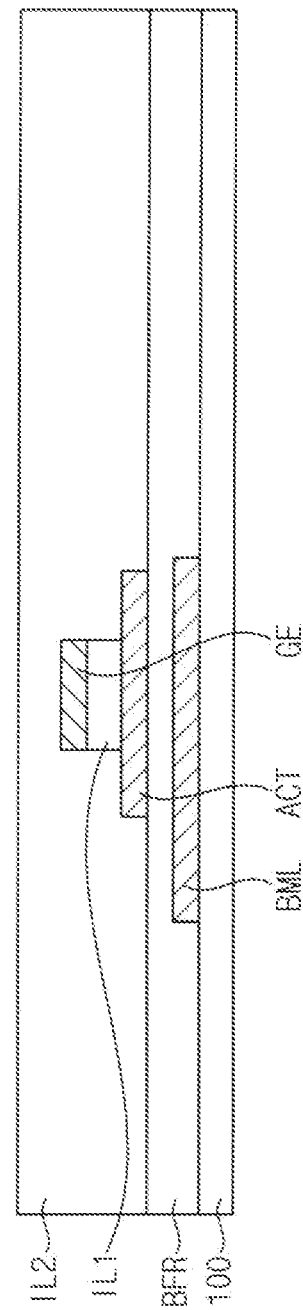

Referring to FIG. 23, a second insulation layer IL2 may be formed on the buffer layer BFR and the active layer ACT. The second insulation layer IL2 may be formed to cover the active layer ACT, the first insulation layer IL1, and the gate electrode GE.

Figure 24:
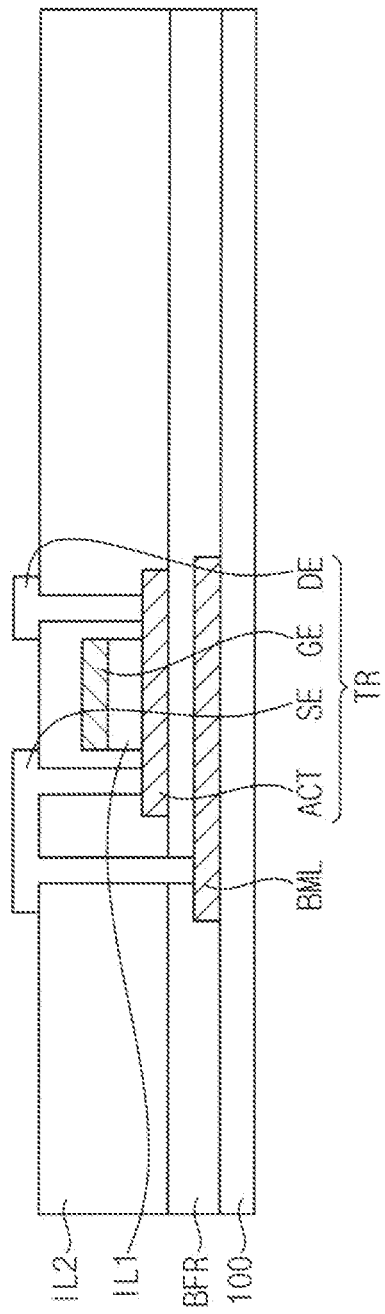

Referring to FIG. 24, a first contact hole may be formed in the buffer layer BFR and the second insulation layer IL2, and a second contact hole and a third contact hole may be formed in the second insulation layer IL2.

A source electrode SE and a drain electrode DE may be formed on the second insulation layer IL2. The source electrode SE may contact the metal pattern BML through the first contact hole, and may contact the source region of the active layer ACT through the second contact hole. The drain electrode DE may contact the drain region of the active layer ACT through the third contact hole. The active layer ACT, the gate electrode GE, the source electrode SE, and the drain electrode DE may form a transistor TR.

Figure 25:
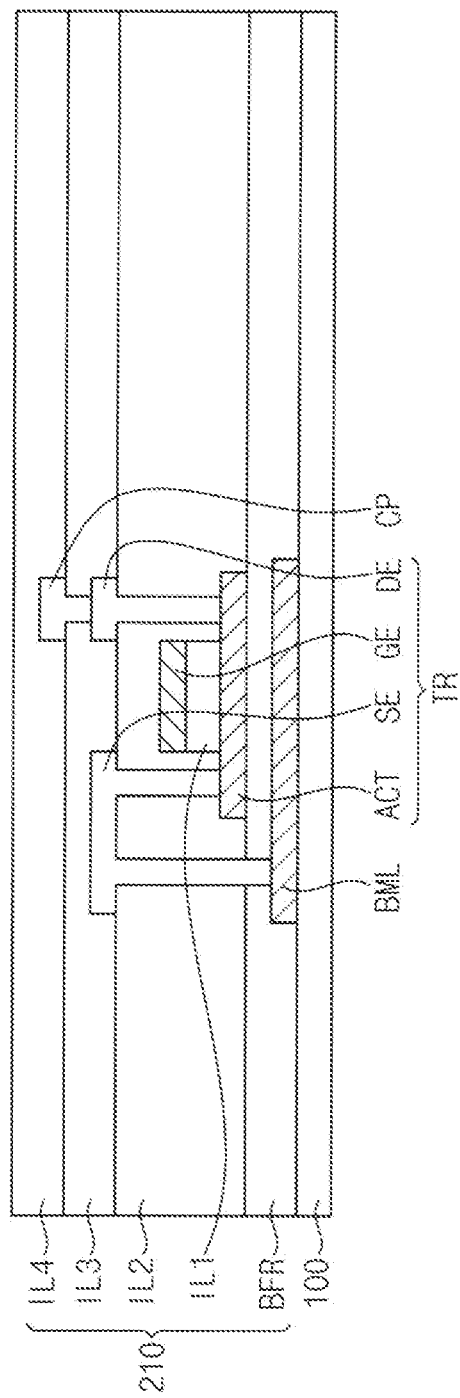

Referring to FIG. 25, a third insulation layer IL3 may be formed on the second insulation layer IL2 to cover the source electrode SE and the drain electrode DE. A fourth contact hole may be formed in the third insulation layer IL3. A connection electrode CP may be formed on the third insulation layer IL3, and the connection electrode CP may contact the drain electrode DE through the fourth contact hole.

A fourth insulation layer IL4 may be formed on the third insulation layer IL3 to cover the connection electrode CP. Accordingly, a circuit element layer 210 may be formed.

Figure 26:
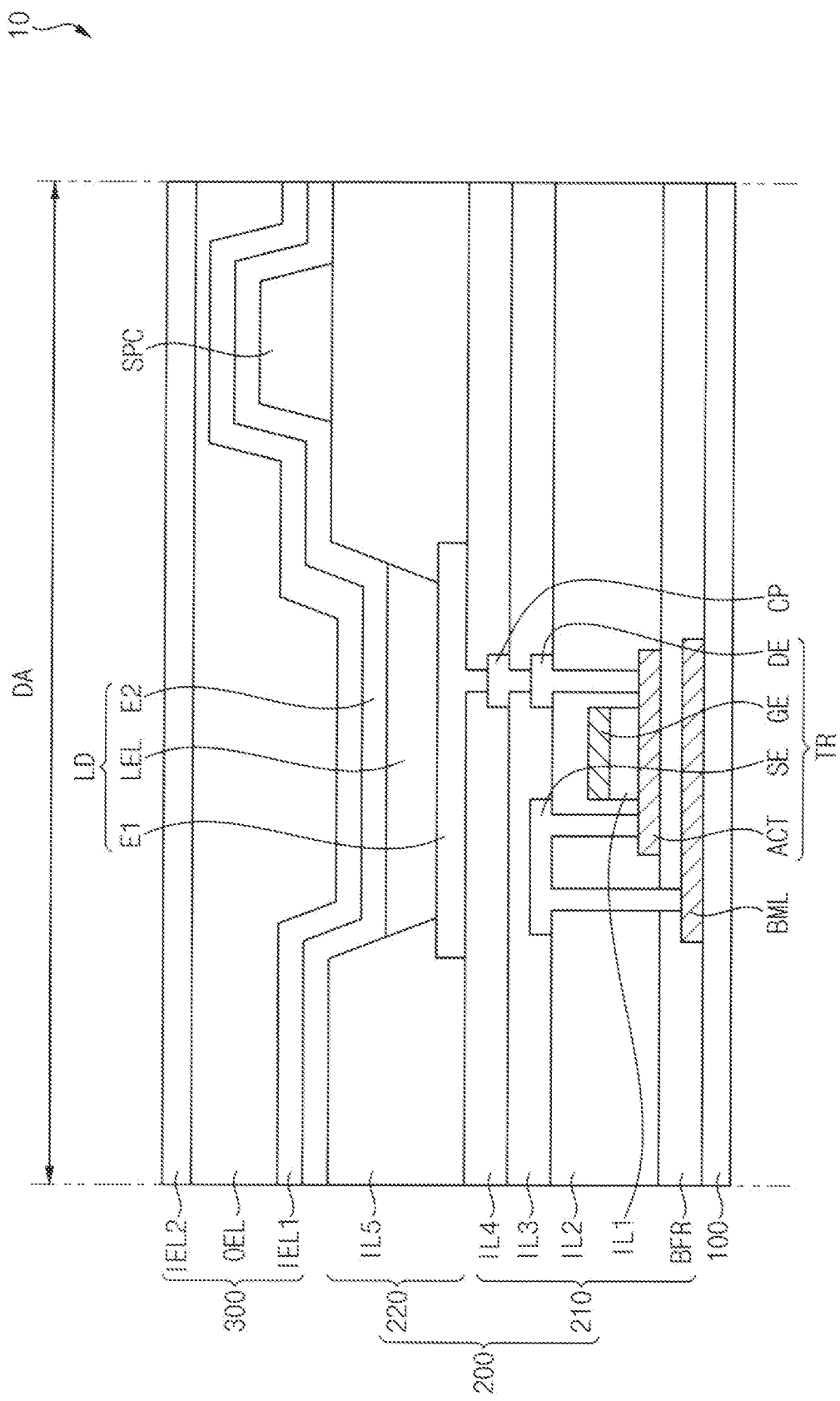

Referring to FIG. 26, a light emitting element layer 220 may be formed on the fourth insulation layer IL4. The circuit element layer 210 and the light emitting element layer 220 may form the display element layer 200.

An encapsulation layer 300 may be formed on the light emitting element layer 220. Accordingly, the display device 10 including the substrate 100, the display element layer 200, and the encapsulation layer 300 may be formed.

In one or more embodiments, because the first alloy layer AL1 includes the titanium alloy, etching rates of the first metal layer ML1 and the first alloy layer AU may be similar to each other. Accordingly, the skew SK1, which is the distance between the end of the first photoresist pattern PR1 and the end of the metal pattern BML may be reduced, and the width of the metal pattern BML may be controlled or selected (e.g., easily controlled or selected). Similarly, because the first alloy layer AL1 includes the titanium alloy, etching rates of the second metal layer ML2 and the second alloy layer AL2 may be similar to each other. Accordingly, the skew SK2, which is the distance between the end of the second photoresist pattern PR2 and the end of the gate electrode GE (or the gate line GL), may be reduced, and the width of the gate electrode GE may be controlled or selected (e.g., easily controlled or selected). Accordingly, a high resolution may be realized in the display device 10.

In one or more embodiments, because the first alloy layer AU and the second alloy layer AL2 include the titanium alloy, the first alloy layer AL1 and the second alloy layer AL2 may prevent or substantially prevent hydrogen from diffusing into the active layer ACT. Accordingly, the performance of the transistor TR may be improved.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," or "connected to" another element or layer, it can be directly on or connected to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "a plurality of," "one of," and other prepositional phrases, when preceding a list of elements, should be understood as including the disjunctive if written as a conjunctive list and vice versa. For example, the expressions "at least one of a, b, or c," "at least one of a, b, and/or c," "one selected from the group consisting of a, b, and c," "at least one selected from a, b, and c," "at least one from among a, b, and c," "one from among a, b, and c", "at least one of a to c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent deviations in measured or calculated values that would be recognized by those of ordinary skill in the art. "Substantially" and "about" as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "substantially" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Further, the use of "may" when describing embodiments of the present disclosure refers to "one or more embodiments of the present disclosure."

In the drawings, the relative sizes of elements, layers, and regions may be exaggerated for clarity.

The display devices according to the embodiments may be applied to a display device included in a computer, a notebook, a mobile phone, a smartphone, a smart pad, a PMP, a PDA, an MP3 player, and/or the like. The light emitting device, electronic apparatus or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the display devices according to the embodiments have been described with reference to the drawings, the illustrated embodiments are examples, and may be modified and changed by a person having ordinary knowledge in the relevant technical field without departing from the spirit and scope of the present disclosure as defined by the following claims and equivalents thereof.

What is claimed is:

1. A display device comprising:
   a substrate;
   a metal pattern on the substrate, the metal pattern comprising a first alloy layer and a first metal layer, wherein the first alloy layer comprises a titanium alloy comprising at least one of copper or zinc and the first metal layer is on the first alloy layer;
   an active layer on the metal pattern; and
   a gate electrode on the active layer, the gate electrode comprising a second alloy layer and a second metal layer, wherein the second alloy layer comprises a titanium alloy comprising at least one of copper or zinc and the second metal layer is on the second alloy layer.

2. The display device of claim 1, wherein each of the first metal layer and the second metal layer comprises copper.

3. The display device of claim 1, wherein the active layer comprises an oxide semiconductor.

4. The display device of claim 1, wherein the first alloy layer and the second alloy layer comprise the same material.

5. The display device of claim 1, wherein a content of titanium in the titanium alloy is about 10 at % to about 80 at %, and
   a content of copper or zinc in the titanium alloy is about 20 at % to about 90 at %.

6. The display device of claim 5, wherein the content of titanium in the titanium alloy is about 20 at % to about 50 at %, and
   the content of copper or zinc in the titanium alloy is about 50 at % to about 80 at %.

7. The display device of claim 1, wherein each of the first alloy layer and the second alloy layer comprises a titanium alloy comprising titanium, copper, and zinc.

8. The display device of claim 1, wherein a thickness of each of the first alloy layer and the second alloy layer is between about 30 Å to about 100 Å.

9. The display device of claim 1, wherein a thickness of each of the first metal layer and the second metal layer is between about 1500 Å to about 4500 Å.

10. The display device of claim 1, wherein a thickness of the metal pattern is the same as a thickness of the gate electrode.

11. A method of manufacturing a display device, the method comprising:
    applying a first alloy layer comprising a titanium alloy comprising at least one of copper or zinc on a substrate;

applying a first metal layer on the first alloy layer;
patterning the first alloy layer and the first metal layer to form a metal pattern;
applying an active layer on the first metal layer;
applying a second alloy layer comprising a titanium alloy comprising at least one of copper or zinc on the active layer;
applying a second metal layer on the second alloy layer; and
patterning the second alloy layer and the second metal layer to form a gate electrode.

12. The method of claim 11, wherein the active layer is formed of an oxide semiconductor.

13. The method of claim 11, wherein the patterning of the first alloy layer and the first metal layer to form the metal pattern comprises,
etching the first alloy layer and the first metal layer utilizing a wet etching technique.

14. The method of claim 11, wherein the patterning of the second alloy layer and the second metal layer to form the gate electrode comprises,
etching the second alloy layer and the second metal layer utilizing a wet etching technique.

15. The method of claim 11, wherein a thickness of the metal pattern and a thickness of the gate electrode are the same.

16. The method of claim 11, wherein the first metal layer and the second metal layer are formed of copper.

17. The method of claim 11, wherein the first alloy layer and the second alloy layer are formed of the titanium alloy,
a content of titanium forming the titanium alloy is about 10 at % to about 80 at %, and
a content of copper or zinc forming the titanium alloy is about 20 at % to about 90 at %.

18. The method of claim 17, wherein the content of titanium forming the titanium alloy is about 20 at % to about 50 at %, and
the content of copper or zinc forming the titanium alloy is about 50 at % to about 80 at %.

19. The method of claim 11, wherein a thickness of each of the first alloy layer and the second alloy layer is between about 30 Å to about 100 Å.

20. The method of claim 11, wherein a thickness of each of the first metal layer and the second metal layer is between about 1500 Å to about 4500 Å.

* * * * *